(12) United States Patent
Wang et al.

(10) Patent No.: US 12,027,086 B2
(45) Date of Patent: Jul. 2, 2024

(54) DRIVING CIRCUIT AND DRIVING METHOD OF DISPLAY PANEL, DISPLAY PANEL, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Zhu Wang, Beijing (CN); Fei Fang, Beijing (CN); Ling Shi, Beijing (CN); Zhenglong Yan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 13 days.

(21) Appl. No.: 17/512,635

(22) Filed: Oct. 27, 2021

(65) Prior Publication Data

US 2022/0270530 A1      Aug. 25, 2022

(30) Foreign Application Priority Data

Feb. 20, 2021    (CN) .......................... 202110194081.3

(51) Int. Cl.
    *G09G 3/00*        (2006.01)
    *G09G 3/3266*    (2016.01)
    *G09G 3/3275*    (2016.01)

(52) U.S. Cl.
    CPC ........... *G09G 3/035* (2020.08); *G09G 3/3266* (2013.01); *G09G 3/3275* (2013.01); *G09G 2300/0819* (2013.01); *G09G 2300/0852* (2013.01); *G09G 2310/0278* (2013.01); *G09G 2310/0286* (2013.01); *G09G 2330/023* (2013.01); *G09G 2354/00* (2013.01)

(58) Field of Classification Search
CPC .... G09G 3/035; G09G 3/3266; G09G 3/3275; G09G 2300/0819; G09G 2300/0852; G09G 2310/0278; G09G 2310/0286; G09G 2330/023; G09G 2354/00
See application file for complete search history.

(56) References Cited

U.S. PATENT DOCUMENTS

| 2016/0225311 | A1* | 8/2016 | Hwang | ................ G09G 3/3208 |
| 2016/0379544 | A1* | 12/2016 | Park | ....................... G09G 5/377 345/694 |
| 2019/0057642 | A1* | 2/2019 | Kim | ....................... G06V 40/19 |
| 2022/0122514 | A1* | 4/2022 | Kwon | ................... G06F 1/1616 |

* cited by examiner

*Primary Examiner* — Xuemei Zheng
*Assistant Examiner* — Nathan P Brittingham
(74) *Attorney, Agent, or Firm* — Ling Wu; Stephen Yang; Ling and Yang Intellectual Property

(57) ABSTRACT

A driving circuit of a display panel includes: a first driving control circuit configured to, in a first display state, provide a signal of an OFF signal terminal to a starting node of a first light emitting signal driver according to a control signal of an ON level provided by a control signal terminal; the first light emitting signal driver configured to, in the first display state, control a light emitting signal output terminal to provide an OFF-level signal to a light emitting control terminal of a pixel driving circuit in a first display region according to the signal of the OFF signal terminal; and a second light emitting signal driver configured to, in the first display state, control a light emitting signal output terminal to provide a light emitting signal to a light emitting control terminal of a pixel driving circuit in a second display region.

19 Claims, 8 Drawing Sheets

US 12,027,086 B2

DRIVING CIRCUIT AND DRIVING METHOD OF DISPLAY PANEL, DISPLAY PANEL, AND DISPLAY APPARATUS

CROSS-REFERENCE TO RELATED APPLICATION

The present application claims priority to Chinese Patent Application No. 202110194081.3 filed to the CNIPA on Feb. 20, 2021, the content of which is incorporated herein by reference.

TECHNICAL FIELD

Embodiments of the present disclosure relate to, but are not limited to, the field of display technologies, and particularly to a driving circuit and driving method of a display panel, a display panel, and a display apparatus.

BACKGROUND

Organic Light Emitting Diode (OLED) display devices have attracted more and more attention due to their advantages such as thinness, lightness, active light emission, low cost, easy formation of flexible structures, and wide viewing angles.

Some OLED display panels (e.g., foldable display panels) may have multiple display regions. When performing partial screen display (e.g., half screen display), all display regions will actually be driven to display, which will lead to higher power consumption of the display panels.

SUMMARY

The following is a summary of subject matter described in detail herein. The summary is not intended to limit the scope of protection of claims.

In a first aspect, an embodiment of the present disclosure provides a driving circuit of a display panel. The display panel includes a first display region and a second display region. The driving circuit includes a first light emitting signal driver and a first driving control circuit corresponding to the first display region, and a second light emitting signal driver corresponding to the second display region.

The first driving control circuit is respectively connected with a control signal terminal, an OFF signal terminal, and a starting node of the first light emitting signal driver, and is configured to, in a first display state, provide a signal of the OFF signal terminal to the starting node of the first light emitting signal driver according to a control signal of an ON level provided by the control signal terminal; wherein, the first display state refers to a state in which the first display region is not displaying and the second display region is displaying.

The first light emitting signal driver is connected with a light emitting control terminal of a pixel driving circuit in the first display region, and is configured to, in the first display state, control a light emitting signal output terminal of the first light emitting signal driver to provide an OFF-level signal to the light emitting control terminal of the pixel driving circuit in the first display region according to the signal of the OFF signal terminal.

The second light emitting signal driver is connected with a light emitting control terminal of a pixel driving circuit in the second display region, and is configured to, in the first display state, provide a signal of a light emitting signal input terminal of the second light emitting signal driver to a starting node of the second light emitting signal driver, and control a light emitting signal output terminal of the second light emitting signal driver to provide a light emitting signal to the light emitting control terminal of the pixel driving circuit in the second display region.

In a second aspect, an embodiment of the present disclosure provides a driving method of a display panel. The display panel includes a first display region, a second display region, and a non-display region located around the first display region and the second display region, each of the first display region and the second display region includes a pixel driving circuit, and the non-display region includes any one of the aforementioned driving circuits. The driving method includes: in a first display state, providing a signal of an OFF signal terminal to a starting node of a first light emitting signal driver according to a control signal of an ON level provided by a control signal terminal; wherein, the first display state refers to a state in which the first display region is not displaying and the second display region is displaying; controlling a light emitting signal output terminal of the first light emitting signal driver to provide an OFF-level signal to a light emitting control terminal of a pixel driving circuit in the first display region according to the signal of the OFF signal terminal; and providing a signal of a light emitting signal input terminal of a second light emitting signal driver to a starting node of the second light emitting signal driver, and controlling a light emitting signal output terminal of the second light emitting signal driver to provide a light emitting signal to a light emitting control terminal of a pixel driving circuit in the second display region.

An embodiment of the present disclosure provides a driving method of a display panel, wherein the display panel includes a first display region, a second display region, and a non-display region located around the first display region and the second display region, each of the first display region and the second display region includes a pixel driving circuit, and the non-display region includes a driving circuit; the driving circuit includes a first light emitting signal driver and a first driving control circuit corresponding to the first display region, and a second light emitting signal driver corresponding to the second display region, wherein, the first driving control circuit is respectively connected with a control signal terminal, an OFF signal terminal, and a starting node of the first light emitting signal driver; the first light emitting signal driver is connected with a light emitting control terminal of a pixel driving circuit in the first display region; the second light emitting signal driver is connected with a light emitting control terminal of a pixel driving circuit in the second display region; the driving method includes: in a first display state, providing, by the first driving control circuit, a signal of the OFF signal terminal to the starting node of the first light emitting signal driver according to a control signal of an ON level provided by the control signal terminal; wherein, the first display state refers to a state in which the first display region is not displaying and the second display region is displaying; in the first display state, controlling, by the first light emitting signal driver, a light emitting signal output terminal of the first light emitting signal driver to provide an OFF-level signal to the light emitting control terminal of the pixel driving circuit in the first display region according to the signal of the OFF signal terminal; in the first display state, providing, by the second light emitting signal driver, a signal of a light emitting signal input terminal of the second light emitting signal driver to a starting node of the second light emitting signal driver, and controlling a light emitting signal output terminal of the second light emitting signal driver to provide a light emitting signal to the light emitting control terminal of the pixel driving circuit in the second display region.

In a third aspect, an embodiment of the present disclosure provides a display panel, which includes a first display region, a second display region, and a non-display region located around the first display region and the second display region, each of the first display region and the second display region includes a pixel driving circuit, and the non-display region includes any of the aforementioned driving circuits.

In a fourth aspect, an embodiment of the present disclosure provides a display apparatus which includes any of the aforementioned display panels.

Other features and advantages of the present disclosure will be described in the subsequent specification, and, in part, become apparent from the specification, or may be understood by implementing the present disclosure. Other advantages of the present disclosure may be achieved and obtained by solutions described in the specification and drawings.

Other aspects may be comprehended upon reading and understanding of the drawings and detailed description.

BRIEF DESCRIPTION OF DRAWINGS

The drawings are used to provide an understanding of technical solutions of the present disclosure, form a part of the specification, and are used to explain, together with the embodiments of the present disclosure, the technical solutions of the present disclosure and are not intended to form limitations on the technical solutions of the present disclosure. Shapes and sizes of each component in the drawings do not reflect true proportions and are only intended to schematically illustrate contents of the present invention.

DETAILED DESCRIPTION

Figure 1A:
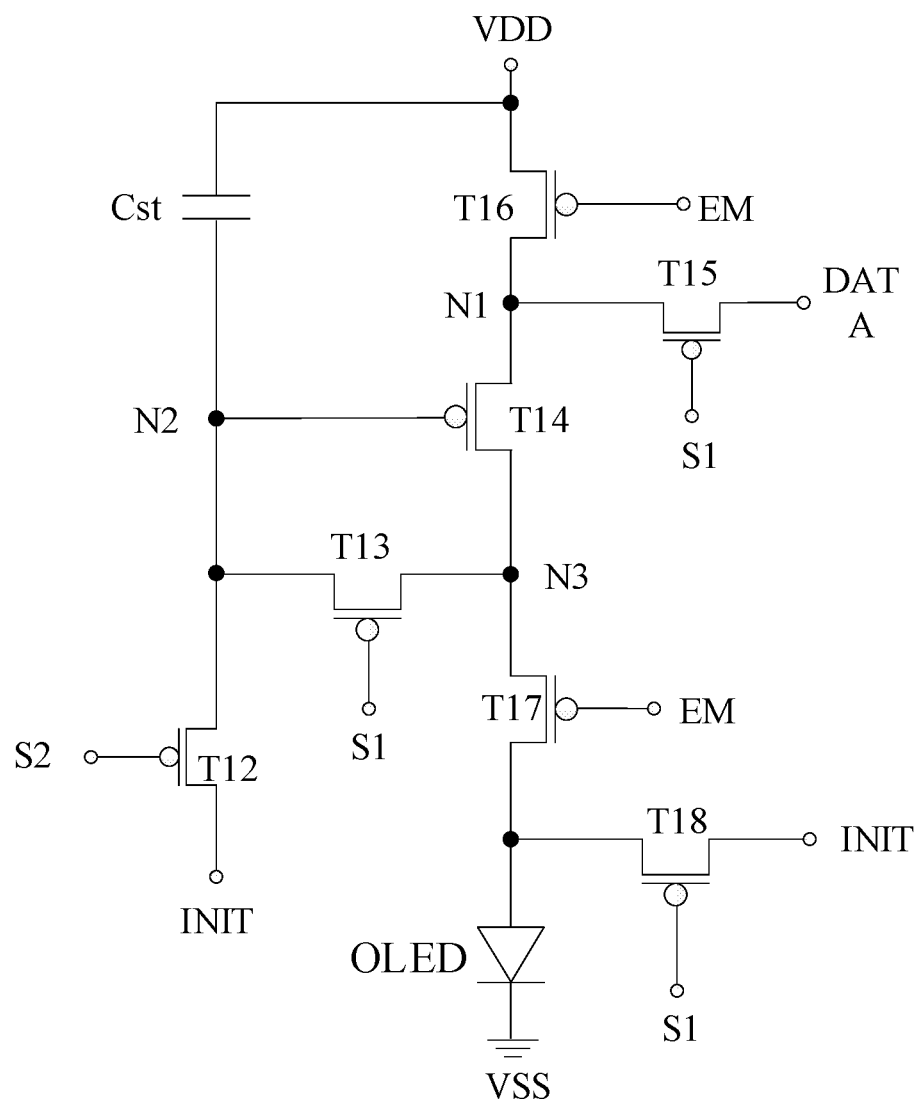
FIG. 1A is a schematic diagram of a structure of a pixel driving circuit.

Hereinafter, the embodiments of the present disclosure will be described in detail in combination with the accompanying drawings. It should be noted that the embodiments may be implemented in multiple different forms. Those of ordinary skills in the art may readily understand a fact that implementation modes and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, a size of each constituent element, or a thickness or region of a layer, is sometimes exaggerated for clarity. Therefore, an implementation mode of the present disclosure is not necessarily limited to the size shown, and a shape and a size of each component in the drawings do not reflect true proportions. In addition, the drawings schematically show ideal examples, and an implementation mode of the present disclosure is not limited to shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientation or positional relations, to describe the positional relations between constituent elements with reference to the drawings, are only for a purpose of facilitating description of this specification and simplifying the description, rather than indicating or implying that an apparatus or element referred to must have a specific orientation, or must be constructed and operated in a particular orientation, and therefore cannot be construed as limitations on the present disclosure. The positional relations between the constituent elements may be appropriately changed according to a direction in which each constituent element is described. Therefore, the wordings are not limited in the specification, and may be replaced appropriately according to situations.

In this specification, terms "install", "connect", and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skill in the art may understand meanings of the terms in the present disclosure according to situations.

In this specification, a transistor refers to an element including at least three terminals, namely, a gate electrode (gate electrode or control electrode), a drain electrode, and a source electrode. The transistor has a channel region between the drain electrode (a drain electrode terminal, a drain region, or a drain electrode) and the source electrode (a source electrode terminal, a source region, or a source electrode), and a current may flow through the drain electrode, the channel region, and the source electrode. It should be noted that in this specification, the channel region refers to a region through which a current mainly flows.

In this specification, a first electrode may be a drain electrode and a second electrode may be a source electrode, or a first electrode may be a source electrode and a second electrode may be a drain electrode. Functions of the "source electrode" and the "drain electrode" are sometimes interchangeable in a case where transistors with opposite polarities are used or in a case where a direction of a current changes during circuit operation. Therefore, in this specification, a "source electrode" and a "drain electrode" are interchangeable.

In this specification, an "electrical connection" includes a case where constituent elements are connected together through an element having a certain electrical function. The "element having a certain electrical function" is not particularly limited as long as it may transmit and receive electrical signals between connected constituent elements. Examples of the "element having a certain electrical function" include not only electrodes and wirings, but also switching elements such as transistors, and include resistors, inductors, capacitors, and other elements having multiple functions.

A switching transistor, a light emitting transistor, a driving transistor, and a driving control transistor used in the embodiments of the present disclosure may be a thin film transistor, or a Field Effect Transistor, or other device with same characteristics. For example, the thin film transistor used in the embodiments of the present disclosure may be an oxide semiconductor transistor. For example, a P-type transistor may be adopted for the switching transistor, the light emitting transistor, and the driving transistor in the embodiments of the present disclosure. The P-type transistor is turned on when a gate electrode is at a low level, and the P-type transistor is turned off when the gate electrode is at a high level. However, the present disclosure is not limited to this. The switching transistor, the light emitting transistor, and the driving transistor in the embodiments of the present disclosure may be an N-type transistor. The N-type transistor is turned on when a gate electrode is at a high level and the N-type transistor is turned off when the gate electrode is at a low level.

Some OLED display panels (such as foldable display panels) with multiple display regions may achieve an Always On Display (AOD) mode, that is, they may achieve partial screen display (for example, half screen display). In case of partial screen display (for example, half screen display), multiple drive Integrated Circuits (ICs) are still used to drive pixels in all display regions for display, while display regions that are not displaying in the multiple display regions are displayed with black images. In this way, drive ICs corresponding to the display regions that are not displaying in the multiple display regions still work, resulting in high power consumption of a display panel in an Always On Display mode. Therefore, a following technical solution is proposed: during partial screen display (e.g., half screen display), a drive IC corresponding to a display region that is not displaying in multiple display regions is controlled to stop working, and a corresponding light emitting signal driver is not driven to output, that is, a light emitting signal driver corresponding to the display region that is not displaying does not provide a light emitting signal to a light emitting control terminal EM of a pixel driving circuit in the display region that is not displaying. However, taking a pixel driving circuit as shown in FIG. 1A as an example, in a partial screen display state, when a light emitting signal driver corresponding to a display region that is not displaying does not provide a light emitting signal to a light emitting control terminal EM of a pixel driving circuit in the display region that is not displaying, the light emitting control terminal EM is in a floating state. However, since a first power supply line VDD and a second power supply line VSS are connected over an entire surface, the first power supply line VDD and the second power supply line VSS will still provide voltage to the pixel driving circuit, which causes the light emitting control terminal EM to be at zero voltage (zero potential) at this time, thus light emitting transistors (i.e., a sixteenth transistor T16 and a seventeenth transistor T17 in FIG. 1A) are not in an off state completely, and further, causing leakage current to emit light, resulting in a problem of high power consumption of a display panel still exists.

Figure 1B:
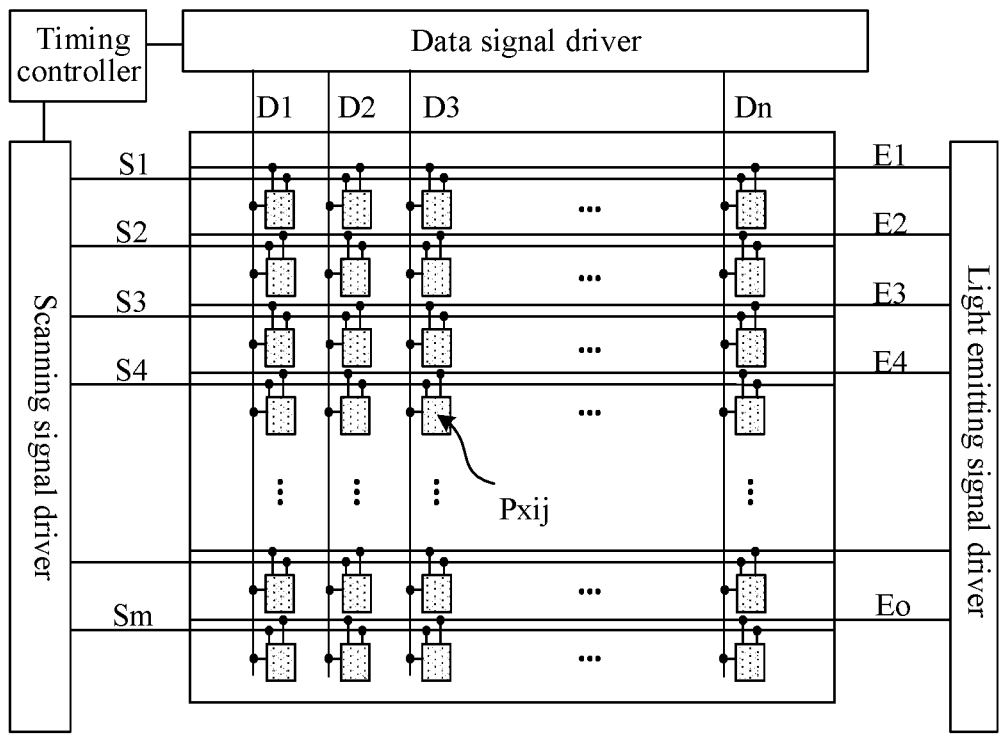
FIG. 1B is a schematic diagram of a structure of a display panel.

An embodiment of the present disclosure provides a display panel, which may be an OLED display panel. As shown in FIG. 1B, the display panel may include a pixel array, which may be divided into N display regions, wherein N is a positive integer greater than or equal to 2. The display panel may also include N timing controllers, N data signal drivers, N scanning signal drivers, and N light emitting signal drivers respectively corresponding to the N display regions. The display panel may also include N groups of scanning signal lines, N groups of data signal lines, and N groups of light emitting signal lines respectively corresponding to the N display regions. Here, FIG. 1B illustrates one display region of the display panel as an example.

Each group of scanning signal lines may include multiple scanning signal lines, each group of data signal lines may include multiple data signal lines, and each group of light emitting signal lines may include multiple light emitting signal lines.

In an exemplary embodiment, each display region may include multiple sub-pixels Pxij, wherein each sub-pixel Pxij may be connected to a corresponding data signal line, a corresponding scanning signal line, and a corresponding light emitting signal line, wherein i and j may be natural numbers. A pixel Pxij may refer to a pixel in which a transistor therein is connected to an i-th scanning signal line and to a j-th data signal line.

In an exemplary embodiment, a timing controller may provide a gray scale value and a control signal suitable for specifications of a data signal driver to the data signal driver, and may provide a clock signal, a scanning start signal, and the like suitable for specifications of a scanning signal driver to the scanning signal driver, and may provide a clock signal, a light emitting stop signal, and the like suitable for specifications of a light emitting signal driver to the light emitting signal driver. The data signal driver may generate data voltages to be provided to data signal lines D1, D2, D3, . . . , and Dn using the gray scale value and the control signal received from the timing controller. For example, the data signal driver may sample the gray scale value by using a clock signal, and apply a data voltage corresponding to the gray scale value to the data signal lines D1 to Dn in units of pixel rows, wherein n may be a natural number. The scanning signal driver may generate scanning signals to be provided to scanning signal lines S1, S2, S3, . . . , and Sm by receiving a clock signal, a scanning start signal, and the like from the timing controller. For example, the scanning signal driver may sequentially provide scanning signals with on-level pulses to the scanning signal lines S1 to Sm. For example, the scanning signal driver may be constructed in a form of a shift register, and may generate scanning signals in such a way that the scanning start signals provided in a form of on-level pulses are sequentially transmitted to a next-stage circuit under control of a clock signal, wherein m may be a natural number. The light emitting signal driver may generate light emitting signals to be provided to light emitting lines E1, E2, E3, . . . , and Eo by receiving the clock signal, the light emitting stop signal, and the like from the timing controller. For example, the light emitting signal driver may sequentially provide light emitting signals with OFF-level pulses to the light emitting signal lines E1 to Eo. For example, the light emitting signal driver may be constructed in a form of a shift register, and may generate light emitting signals in such a way that light emitting stop signals provided in a form of OFF-level pulses are sequentially transmitted to a next-stage circuit under control of a clock signal, wherein o may be a natural number.

Figure 1C:
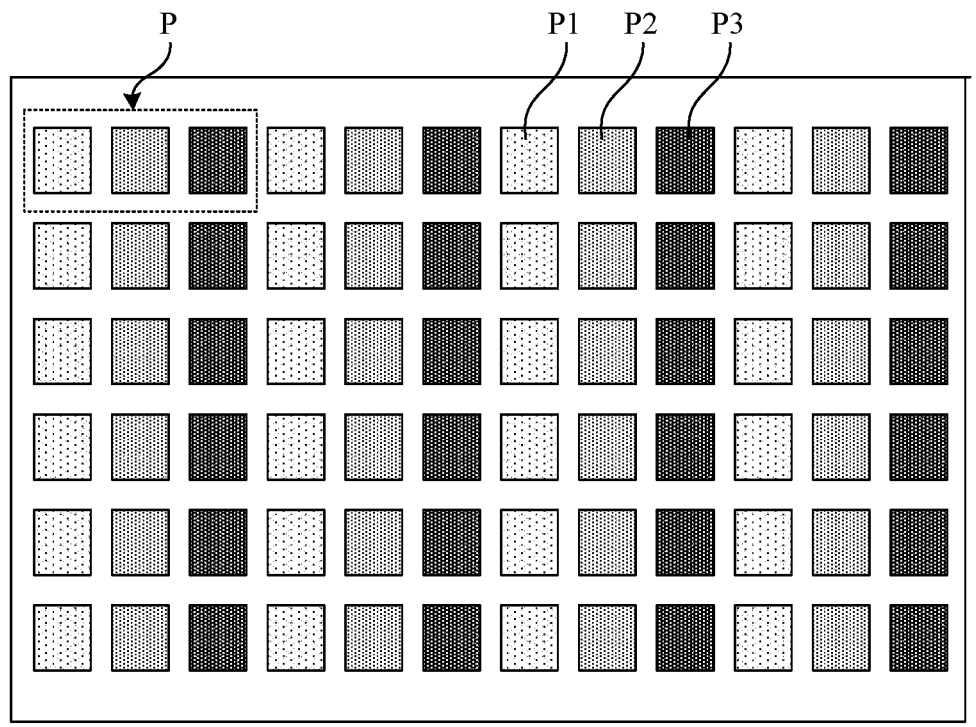
FIG. 1C is a schematic diagram of a planar structure of a display panel.

FIG. 1C is a schematic diagram of a planar structure of a display panel. As shown in FIG. 1C, a display region of the display panel may include multiple pixel units P arranged in a matrix manner. At least one of the multiple pixel units P includes a first light emitting unit (sub-pixel) P1 that emits light of a first color, a second light emitting unit P2 that emits light of a second color, and a third light emitting unit P3 that emits light of a third color. The first light emitting unit P1, the second light emitting unit P2, and the third light emitting unit P3 each include a pixel driving circuit and a light emitting device. A pixel driving circuit in the first light emitting unit P1 is connected to a scanning signal line, a pixel driving circuit in the second light emitting unit P2 is connected to a data signal line, a pixel driving circuit in the third light emitting unit P3 is connected to a light emitting signal line. And a pixel driving circuit is configured to receive a data voltage transmitted through a data signal line under control of a scanning signal line and a light emitting signal line, and output a corresponding current to a light emitting device. A light emitting device in the first light emitting unit P1 is connected to a pixel driving circuit of a light emitting unit wherein the first light emitting unit P1 is located, a light emitting device in the second light emitting unit P2 is connected to a pixel driving circuit of a light emitting unit where the second light emitting unit P2 is located, and a light emitting device in the third light emitting unit P3 is connected to a pixel driving circuit of a light emitting unit where the third light emitting unit P3 is located. A light emitting device is configured to emit light of corresponding brightness in response to a current output by a pixel driving circuit of a light emitting unit where this light emitting device is located.

In an exemplary embodiment, a pixel unit P may include a red (R) light emitting unit, a green (G) light emitting unit, and a blue (B) light emitting unit, or may include a red light emitting unit, a green light emitting unit, a blue light emitting unit, and a white light emitting unit, which is not limited in the present disclosure. In an exemplary embodiment, a shape of a light emitting unit in a pixel unit may be a rectangle, a rhombus, a pentagon, or a hexagon. When a pixel unit includes three light emitting units, the three light emitting units may be arranged in a manner to stand side by side horizontally, in a manner to stand side by side vertically, or in a pyramid manner with two units sitting at the bottom and one unit placed on top. When a pixel unit includes four light emitting units, the four light emitting units may be arranged in a manner to stand side by side horizontally, in a manner to stand side by side vertically, or a Square manner, which is not limited in the present disclosure.

Figure 1D:
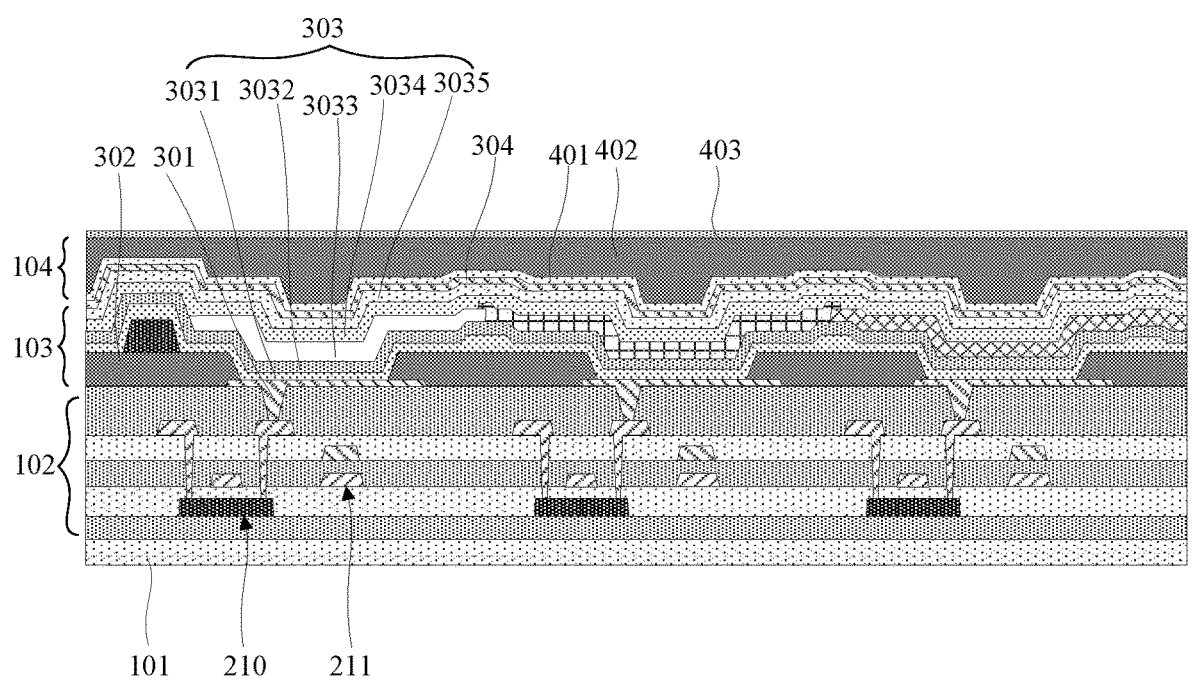
FIG. 1D is a schematic diagram of a sectional structure of a display panel.

FIG. 1D is a schematic diagram of a sectional structure of a display panel, showing a structure of three sub-pixels in an OLED display panel. Referring to FIG. 1D, on a plane perpendicular to the display panel, the display panel may include a driving circuit layer 102 disposed on a base substrate 101, a light emitting device 103 disposed on a side of the driving circuit layer 102 away from the base substrate 101, and an encapsulation layer 104 disposed on a side of the light emitting device 103 away from the base substrate 101.

In an exemplary implementation, the base substrate 101 may be a flexible base substrate or may be a rigid base substrate. A driving circuit layer 102 of each sub-pixel may include multiple transistors and multiple storage capacitors constituting a pixel driving circuit, an example of which is illustrated in FIG. 1D where each sub-pixel includes a transistor 210 and a storage capacitor 211. The light emitting device 103 may include an anode 301, a pixel definition layer 302, an organic light emitting layer 303, and a cathode 304. The anode 301 is connected to a drain electrode of a driving transistor 210 through a via, the organic light emitting layer 303 is connected to the anode 301, and the cathode 304 is connected to the organic light emitting layer 303, The organic light emitting layer 303 emits light of a corresponding color under drive of the anode 301 and the cathode 304. An encapsulation layer 104 may include a first encapsulation layer 401, a second encapsulation layer 402, and a third encapsulation layer 403 that are stacked together; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external moisture cannot enter into the light emitting device 103.

In an exemplary embodiment, as shown in FIG. 1D, an organic light emitting layer 303 may include a Hole Injection Layer (HIL), a Hole Transport Layer (HTL) 3031, an Electron Block Layer (EBL) 3032, an Emitting Layer (EML) 3033, a Hole Block Layer (HBL) 3034, an Electron Transport Layer (ETL) 3035, and an Electron Injection Layer (EIL). In some exemplary embodiments, hole injection layers and electron injection layers of all sub-pixels may be connected together as a common layer, hole transport layers and electron transport layers of all sub-pixels may be connected together as a common layer, and hole block layers of all sub-pixels may be connected together as a common layer, and emitting layers and electron block layers of adjacent sub-pixels may be isolated or be slightly overlapped.

In an exemplary embodiment, a material of a cathode may be a transparent conductive oxide, such as Indium Zinc Oxide (IZO).

In addition, the display panel may include other necessary components and structures, such as spacer pillars, in addition to the above-mentioned substrate, light emitting device, and pixel driving circuit, and the present disclosure is not limited here. Those skilled in the art may design and supplement according to a type of the display panel accordingly, which will not be repeated here.

Figure 2:
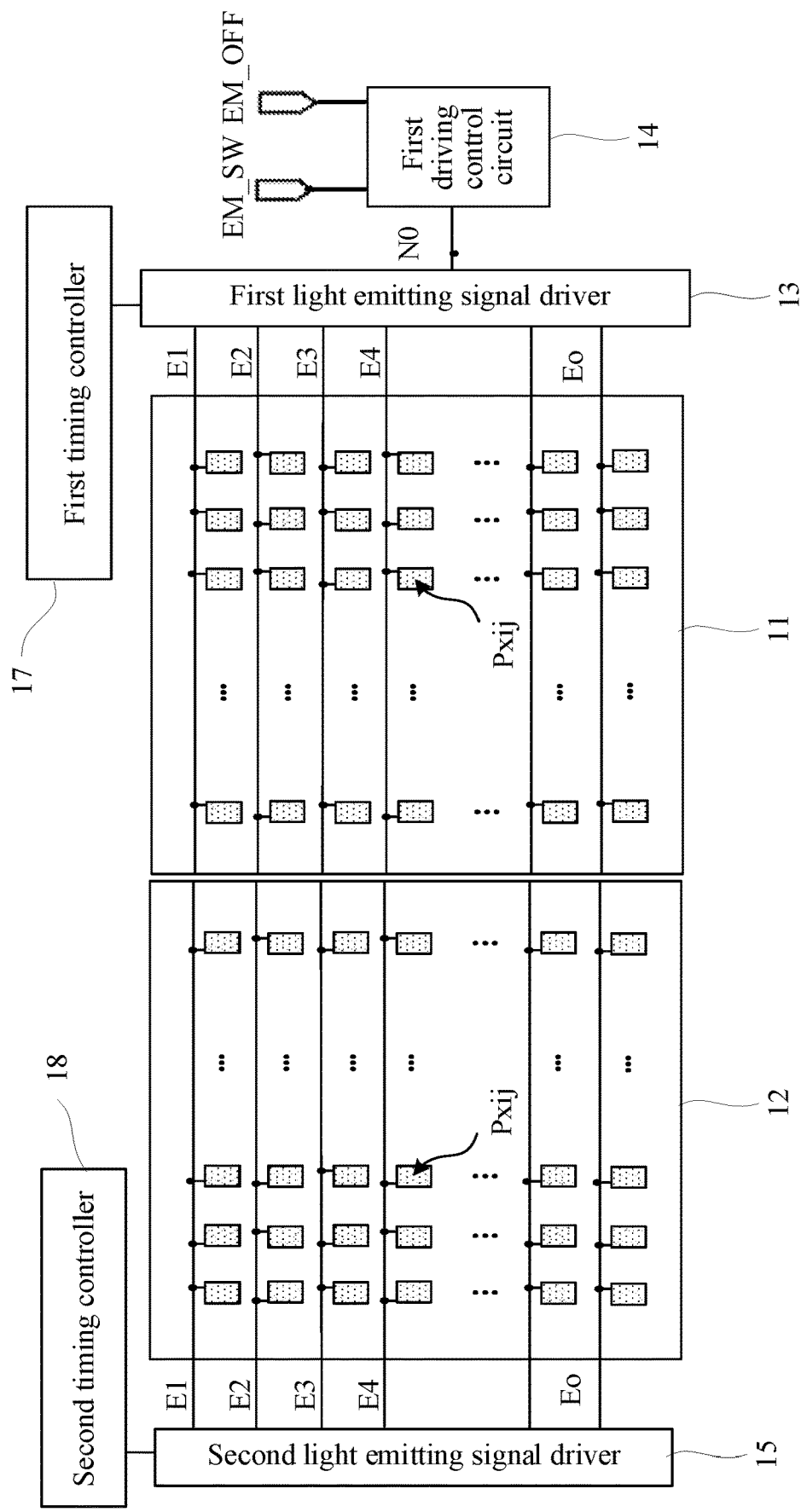
FIG. 2 is a schematic diagram of a structure of a driving circuit of a display panel according to an embodiment of the present disclosure.

An embodiment of the present disclosure provides a driving circuit of a display panel. FIG. 2 is a schematic diagram of a structure of a driving circuit of a display panel according to an embodiment of the present disclosure. As shown in FIG. 2, the display panel may include a first display region 11 and a second display region 12. The driving circuit of the display panel may include a first light emitting signal driver 13 corresponding to the first display region 11, a first driving control circuit 14 corresponding to the first display region 11, and a second light emitting signal driver 15 corresponding to the second display region 12. The first driving control circuit 14 is respectively connected with a control signal terminal EM_SW, an OFF signal terminal EM_OFF, and a starting node NO of the first light emitting signal driver 13. The first light emitting signal driver 13 is connected to a light emitting control terminal EM of a pixel driving circuit in the first display region 11. The second light emitting signal driver 15 is connected to a light emitting control terminal EM of a pixel driving circuit in the second display region 12. Here, in FIG. 2, taking a quantity of first display regions as one and a quantity of second display regions as one, the driving circuit includes one first driving control circuit corresponding to one first display region 11 as an example for illustration.

In an exemplary embodiment, a quantity of first display regions may be one, or may be multiple, such as two or three. Correspondingly, a quantity of first light emitting signal drivers and first driving control circuits may be one, or may be multiple, such as two or three. Here, the embodiments of the present disclosure are not limited here.

In an exemplary embodiment, a quantity of second display regions may be one, or may be multiple, such as two or three. Correspondingly, a quantity of second light emitting signal drivers and second driving control circuits may be one, or may be multiple, such as two or three. Here, the embodiments of the present disclosure are not limited here.

In an exemplary embodiment, at least one of a first display region and a second display region may be provided with a corresponding driving control circuit. For example, only a first display region may be provided with a corresponding driving control circuits, as shown in FIG. 2, only a first display region may be provided with a corresponding first driving control circuit, and a second display region is not provided with a corresponding driving control circuit. For another example, both a first display region and a second display region may be provided with corresponding driving control circuits, as shown in FIG. 3, a first display region may be provided with a corresponding first driving control circuit, and a second display region may be provided with a corresponding second driving control circuit.

Figure 3:
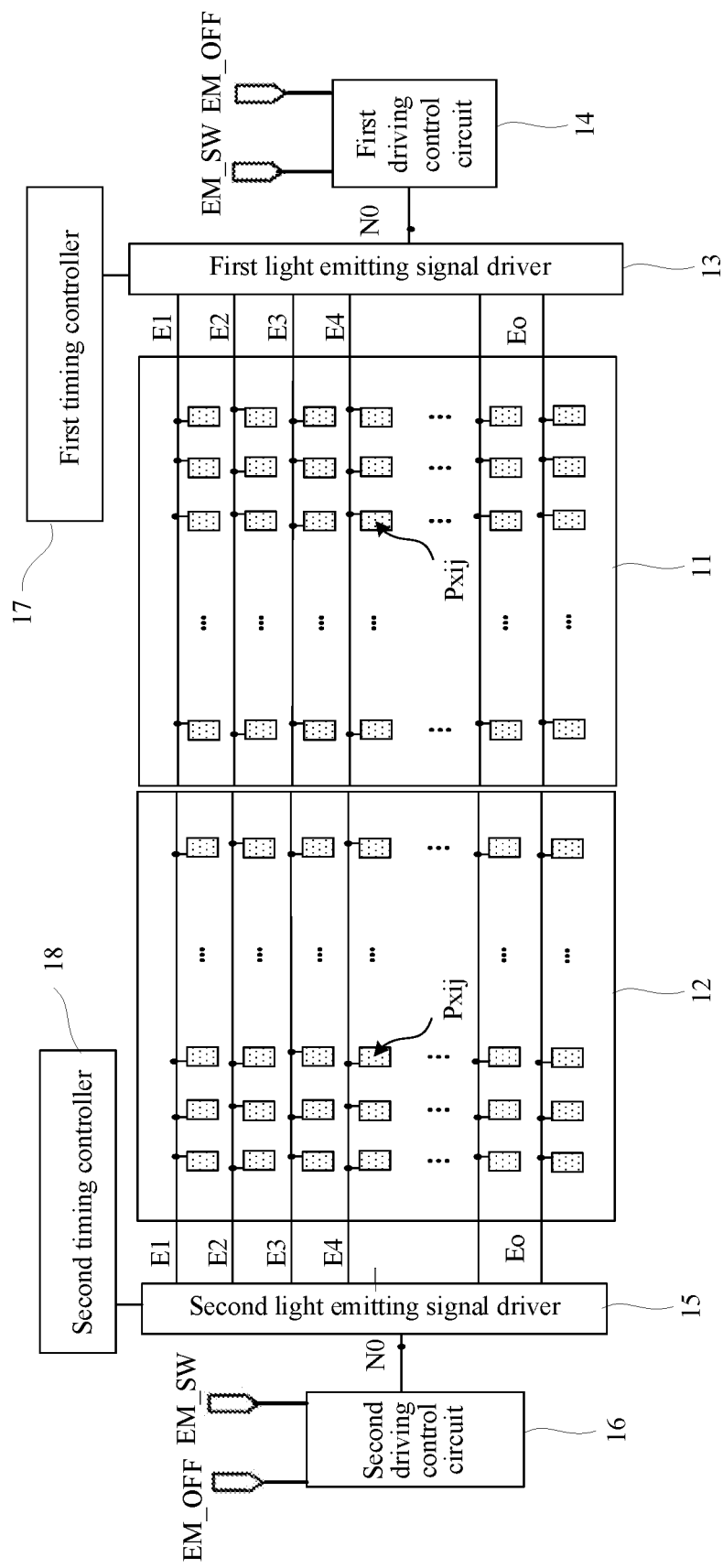
FIG. 3 is a schematic diagram of another structure of a driving circuit of a display panel according to an embodiment of the present disclosure.

In an exemplary embodiment, taking the driving circuit of the display panel shown in FIGS. 2 and 3 as an example, a first display state may refer to a state in which a first display region 11 is not displaying and a second display region 12 is displaying; a second display state may refer to a state in which the first display region 11 is displaying and the second display region 12 is displaying; the third display state may refer to a state in which the first display region 11 is displaying and the second display region 12 is not displaying; and a fourth display state may refer to a state in which the first display region 11 is not displaying and the second display region 12 is not displaying.

In an exemplary embodiment, as shown in FIG. 2, in a first display state, a first driving control circuit 14 is configured to control an OFF signal terminal EM_OFF to provide a signal to a starting node NO of a first light emitting signal driver 13 according to a control signal of an ON level provided by a control signal terminal EM_SW. The first light emitting signal driver 13 is configured to, under control of a clock signal terminal of the first light emitting signal driver 13, control a light emitting signal output terminal of the first light emitting signal driver 13 to provide an OFF-level signal to a light emitting control terminal EM of a pixel driving circuit in a first display region 11 according to a signal of the OFF signal terminal EM_OFF. A second light emitting signal driver 15 is configured to: provide a signal of a light emitting signal input terminal ESTV of the second light emitting signal driver 15 to a starting node NO of the second light emitting signal driver 15; and, under control of a clock signal terminal of the second light emitting signal driver 15, control a light emitting signal output terminal EOUT of the second light emitting signal driver 15 to provide a light emitting signal to a light emitting control terminal EM of a pixel driving circuit in a second display region 12 according to the signal of the light emitting signal input terminal ESTV of the second light emitting signal driver 15. In this way, affected by the signal of OFF signal terminal EM_OFF adversely, the light emitting control terminal EM of the pixel driving circuit in the first display region 11 is in an OFF state during partial screen display. Furthermore, the light emitting control terminal EM of the pixel driving circuit in the second display region 12 is in a normal state and is not affected by the signal of OFF signal terminal EM_OFF adversely. Therefore, power consumption of the display panel may be reduced during partial screen display.

For example, taking a pixel driving circuit in a first display region as the pixel driving circuit shown in FIG. 1A as an example, and taking all transistors in FIG. 1A as P-type transistors as an example for illustration, an OFF-level signal may be a signal of an OFF-level. At this time, a voltage of a light emitting control terminal EM is an OFF-voltage. Since control electrodes of corresponding transistors (i.e., the sixteenth transistor T16 and the seventeenth transistor T17 in FIG. 1A) in a pixel driving circuit in a first display region 11 are connected to the light emitting control terminal EM, the sixteenth transistor T16 and the seventeenth transistor T17 in the pixel driving circuit in the first display region 11 may be turned off under control of the light emitting control terminal EM. In other words, the fifth transistor T5 and the sixth transistor T6 are in a completely OFF state when the first display region 11 is in a state of not displaying. In this way, leakage current to emit light may be avoided and power consumption of a display panel may be reduced.

In an exemplary embodiment, as shown in FIG. 2, in a second display state, a first driving control circuit 14 is configured to control a light emitting signal input terminal ESTV of a first light emitting signal driver 13 to provide a signal to a starting node NO of the first light emitting signal driver 13 according to a control signal of an OFF level provided by a control signal terminal EM_SW. The first light emitting signal driver 13 is configured to, under control of a clock signal terminal of the first light emitting signal driver 13, control a light emitting signal output terminal EOUT of the first light emitting signal driver 13 to provide a light emitting signal to a light emitting control terminal EM of a pixel driving circuit in a first display region 11 according to the signal of the light emitting signal input terminal ESTV of the first light emitting signal driver 13. A second light emitting signal driver 15 is configured to: provide a signal of a light emitting signal input terminal ESTV of the second light emitting signal driver 15 to a starting node NO of the second light emitting signal driver 15; and, under a control of a clock signal terminal of the second light emitting signal driver 15, control a light emitting signal output terminal EOUT of the second light emitting signal driver 15 to provide a light emitting signal to a light emitting control terminal EM of a pixel driving circuit in a second display region 12 according to the signal of the light emitting signal input terminal ESTV of the second light emitting signal driver 15. In this way, during normal full-screen display, both the light emitting control terminal EM of the pixel driving circuit in the first display region 11 and the light emitting control terminal EM of the pixel driving circuit in the second display region 12 are in a normal state and are not affected by a signal of an OFF signal terminal EM_OFF adversely.

FIG. 3 is a schematic diagram of another structure of a driving circuit of a display panel according to an embodiment of the present disclosure. On a basis of the driving circuit of the display panel shown in FIG. 2, the driving circuit of the display panel shown in FIG. 3 may further include a second driving control circuit 16 corresponding to a second display region 12. As shown in FIG. 3, the second driving control circuit 16 may be connected to a control signal terminal EM_SW, an OFF signal terminal EM_OFF, a starting node NO of a second light emitting signal driver 15, and a clock signal terminal CLK L of the second light emitting signal driver 15, respectively. Here, other circuit structures in the driving circuit of the display panel shown in FIG. 3 (for example, a first light emitting signal driver 13, a first driving control circuit 14, and the second light emitting signal driver 15) are basically the same as those of the driving circuit of the display panel shown in FIG. 2, and will not be repeated here. Here, in FIG. 3, that the driving circuit includes driving control circuits corresponding to two display regions one-to-one (i.e., the first driving control circuit 14 corresponding to the first display region 11 and the second driving control circuit 16 corresponding to the second display region 12) is taken as an example for illustration.

In an exemplary embodiment, as shown in FIG. 3, in a third display state or a fourth display state (i.e., a state where a second display region is not displaying), a second driving control circuit 16 is configured to control an OFF signal terminal EM_OFF to provide a signal to a starting node NO of a second light emitting signal driver 15 according to a control signal of an ON level provided by a control signal terminal EM_SW. The second light emitting signal driver 15 is further configured to, under control of a clock signal terminal of the second light emitting signal driver 15, control a light emitting signal output terminal EOUT of the second light emitting signal driver 15 to provide an OFF-level signal to a light emitting control terminal EM of a pixel driving circuit in the second display region 12 according to a signal of the OFF signal terminal EM_OFF. In this way, affected by the signal of the OFF signal terminal EM_OFF adversely, the light emitting control terminal EM of the pixel driving circuit in the second display region is in an OFF state during partial screen display, so that power consumption of a display panel may be reduced during partial screen display.

In an exemplary embodiment, as shown in FIG. 3, in a first display state or a second display state (i.e., a state where a second display region is displaying), a second driving control circuit 16 is further configured to control a light emitting signal input terminal ESTV of a second light emitting signal driver 15 to provide a signal to a starting node NO of the second light emitting signal driver 15 according to a control signal of an OFF level provided by a control signal terminal EM_SW.

Figure 4:
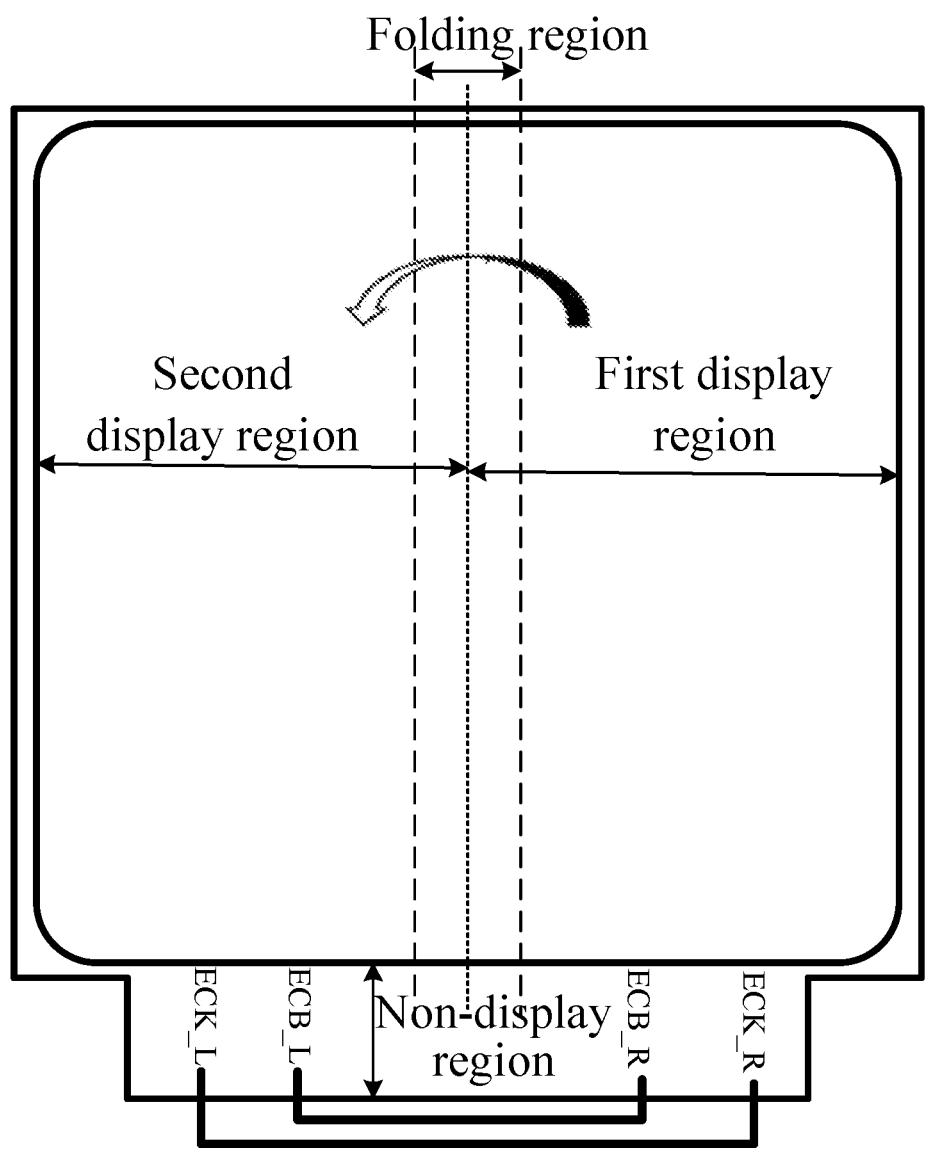
FIG. 4 is a schematic diagram of a structure of a display panel according to an embodiment of the present disclosure.

In an exemplary embodiment, as shown in FIG. 4, in a first display state, a clock signal terminal of a second light emitting signal driver 15 provides a signal to a clock signal terminal of a first light emitting signal driver 13. In this way, it can be ensured that a first driving control circuit 14 can receive a clock signal and work normally when a first display region 11 is not displaying and a second display region 12 is displaying, thereby controlling a pixel driving circuit in the first display region 11 to be in a completely OFF state (for example, to control a corresponding transistor in a pixel driving circuit in a first display region to be OFF), which avoids leakage current to emit light and reduces power consumption of a display panel.

In an exemplary embodiment, as shown in FIG. 4, in a third display state, a signal is provided to a clock signal terminal of a second light emitting signal driver 15 through a clock signal terminal of a first light emitting signal driver 13. In this way, it can be ensured that the second driving control circuit 15 can receive a clock signal and work normally when the second display region 12 is not displaying and the first display region 11 is displaying, thereby controlling a pixel driving circuit in the second display region 12 to be in a completely OFF state (for example, controlling a corresponding transistor in a pixel driving circuit in the second display region to be OFF), which avoids leakage current to emit light and reduces power consumption of a display panel.

For example, as shown in FIG. 4, in a first display state, a clock signal terminal of a second light emitting signal driver 15 (e.g., a first clock signal terminal ECK_R or a second clock signal ECB_R of a second light emitting signal driver 15) corresponding to a second display region 12 on the left may be provided to a clock signal terminal of a first light emitting signal driver 13 (e.g., a first clock signal terminal ECK_L or a second clock signal ECB_L of a first light emitting signal driver 13) corresponding to a first display region 11 on the right through a Flexible Printed Circuit (FPC) signal wiring. Or, in a third display state, a clock signal terminal of a first light emitting signal driver 13 (e.g., a first clock signal terminal ECK_L or a second clock signal ECB_L of a first light emitting signal driver 13) corresponding to a first display region 11 on the right may be provided to a clock signal terminal of a second light emitting signal driver 15 (e.g., a first clock signal terminal ECK_R or a second clock signal ECB_R of a second light emitting signal driver 15) corresponding to a second display region 12 on the left through an FPC signal wiring.

In an exemplary embodiment, as shown in FIGS. 2 and 3, the driving circuit of the display panel may further include a first timing controller 17 corresponding to a first display region 11 and a second timing controller 18 corresponding to a second display region 12. The first timing controller 17 is connected with a clock signal terminal of a first light emitting signal driver 13 and is configured to, in a first display state or a fourth display state, stop providing a signal to the clock signal terminal of the first light emitting signal driver 13; or, in a second display state or a third display state, provide a signal to the clock signal terminal of the first light emitting signal driver 13. The second timing controller 18 is connected with a clock signal terminal of a second light emitting signal driver 15 and is configured to, in a third display state or a fourth display state, stop providing a signal to the clock signal terminal of the second light emitting signal driver 15; or, in a first display state or a second display state, provide a signal to the clock signal terminal of the second light emitting signal driver 15.

For example, as shown in FIGS. 2 and 3, a first timing controller 17 corresponding to a first display region 11 may provide a gray scale value and a control signal suitable for specifications of a data signal driver corresponding to the first display region 11 to the data signal driver corresponding to the first display region 11, and may provide a clock signal and a scanning start signal, etc. suitable for specifications of a scanning signal driver corresponding to the first display region 11 to the scanning signal driver corresponding to the first display region 11, and may provide a clock signal and a light emitting stop signal, etc. suitable for specifications of a light emitting signal driver corresponding to the first display region 11 to the light emitting signal driver corresponding to the first display region 11. Or, a second timing controller 18 corresponding to a second display region 12 may provide a gray scale value and a control signal suitable for specifications of a data signal driver corresponding to the second display region 12 to the data signal driver corresponding to the second display region 12, and may provide a clock signal and a scanning start signal, etc. suitable for specifications of a scanning signal driver corresponding to the second display region 12 to the scanning signal driver corresponding to the second display region 12, and may provide a clock signal and a light emitting stop signal, etc. suitable for specifications of a light emitting signal driver corresponding to the second display region 12 to the light emitting signal driver corresponding to the second display region 12.

In an exemplary embodiment, a first driving control circuit and a second driving control circuit may be any one of a Field Effect Transistor and a thin film transistor. For example, the Field Effect Transistor may be a single-gate Field Effect Transistor or a multi-gate Field Effect Transistor (e.g., a double-gate Field Effect Transistor).

In an exemplary embodiment, implementation modes of a second driving control circuit and a first driving control circuit may be the same. For example, the first driving control circuit and the second driving control circuit may be driving control transistors. For another example, the first driving control circuit and the second driving control circuit may be double-gate Field Effect Transistors, wherein a first gate and a second gate of a double-gate Field Effect Transistor are connected, and then connected to a control signal terminal.

In an exemplary embodiment, a first driving control circuit may include a driving control transistor, and a control electrode of the driving control transistor is connected to a control signal terminal, a first electrode of the driving control transistor is connected to an OFF signal terminal, and a second electrode of the driving control transistor is connected to a starting node of a first light emitting signal driver. Similarly, a second driving control circuit may be achieved by a driving control transistor, and a connection mode is different from that of the first driving control circuit, for example, a second electrode of a driving control transistor is connected to a starting node of a second light emitting signal driver.

In an exemplary embodiment, each of a first light emitting signal driver and a second light emitting signal driver may include multiple cascaded shift registers.

Figure 5A:
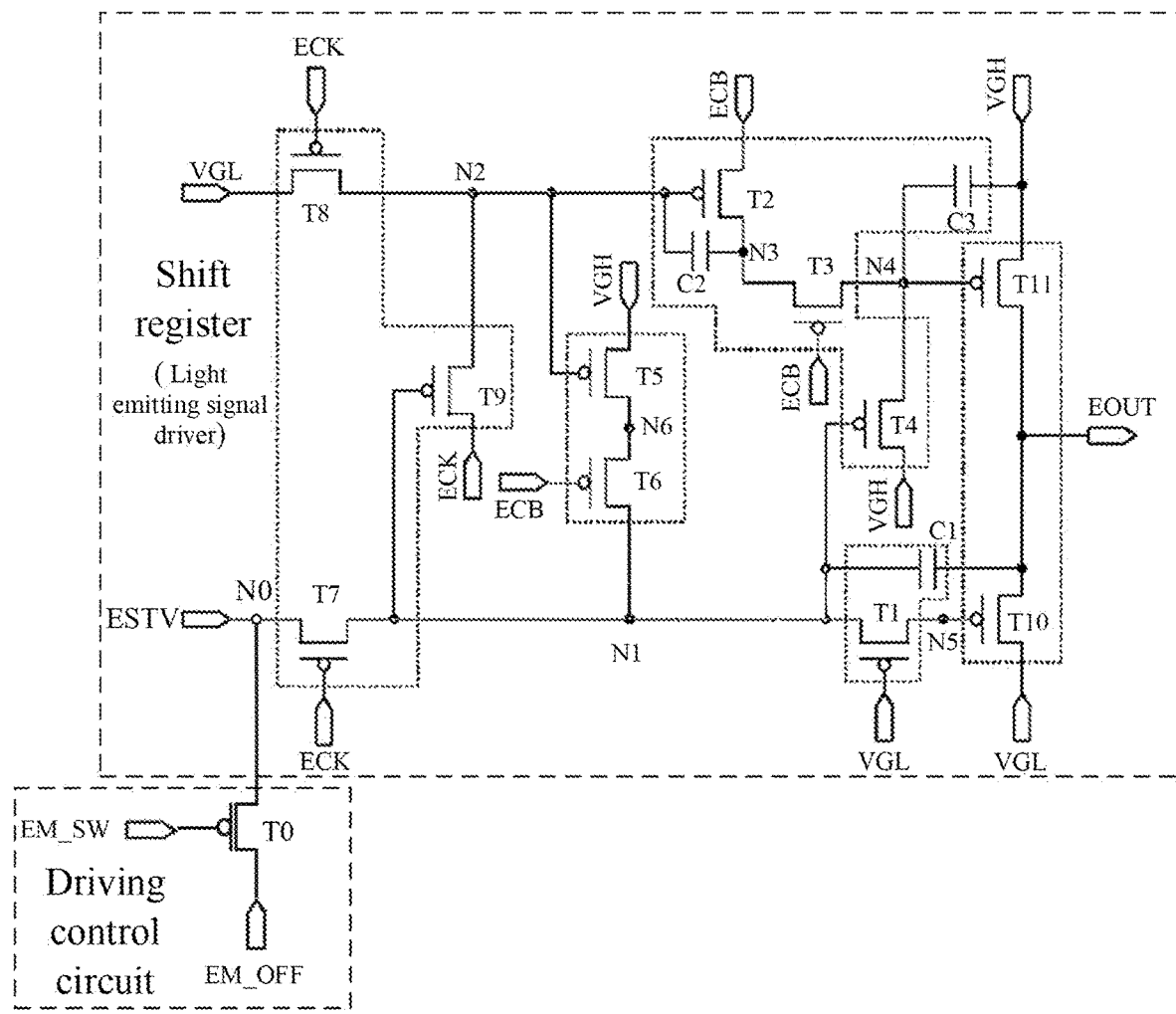
FIG. 5A is a schematic diagram of a circuit of a shift register according to an embodiment of the present disclosure.

FIG. 5A is a schematic diagram of a circuit of a shift register according to an embodiment of the present disclosure. In an exemplary embodiment, as shown in FIG. 5A, the shift register may include an input unit, a first control unit, a second control unit, an output unit, and a voltage stabilizing unit.

As shown in FIG. 5A, the input unit may include a seventh transistor T7, an eighth transistor T8, and a ninth transistor T9. A control electrode of the seventh transistor T7 is connected to a first clock signal terminal ECK, a first electrode of the seventh transistor T7 is connected to a starting node N0, which is connected to a light emitting signal input terminal ESTV, and a second electrode of the seventh transistor T7 is connected to a first node N1. A control electrode of the eighth transistor T8 is connected to the first clock signal terminal ECK, a first electrode of the eighth transistor T8 is connected to a first power supply terminal VGL, and a second electrode of the eighth transistor T8 is connected to a second node N2. A control electrode of the ninth transistor T9 is connected to the first node N1, a first electrode of the ninth transistor T9 is connected to the first clock signal terminal ECK, and a second electrode of the ninth transistor T9 is connected to the second node N2.

As shown in FIG. 5A, the first control unit may include a second transistor T2, a third transistor T3, a fourth transistor T4, a second capacitor C2, and a third capacitor C3. A control electrode of the second transistor T2 is connected to the second node N2, a first electrode of the second transistor T2 is connected to a second clock signal terminal ECB, and a second electrode of the second transistor T2 is connected to a third node N3. A first electrode of the second capacitor C2 is connected to the second node N2, and a second electrode of the second capacitor C2 is connected to the third node N3. A control electrode of the third transistor T3 is connected to the second clock signal terminal ECB, a first electrode of the third transistor T3 is connected to the third node N3, and a second electrode of the third transistor T3 is connected to a fourth node N4. A first electrode of the third capacitor C3 is connected to a second power supply terminal VGH, and a second electrode of the third capacitor C3 is connected to the fourth node N4. A control electrode of the fourth transistor T4 is connected to the first node N1, a second electrode of the fourth transistor T4 is connected to the second power supply terminal VGH, and a first electrode of the fourth transistor T4 is connected to the fourth node N4.

As shown in FIG. 5A, the second control unit may include a fifth transistor T5 and a sixth transistor T6. A control electrode of the fifth transistor T5 is connected to the second node N2, a first electrode of the fifth transistor T5 is connected to the second power supply terminal VGH, and a second electrode of the fifth transistor T5 is connected to a sixth node N6. A control electrode of the sixth transistor T6 is connected to the second clock signal terminal ECB, a first electrode of the sixth transistor T6 is connected to the sixth node N6, and a second electrode of the sixth transistor T6 is connected to the first node N1.

As shown in FIG. 5A, the output unit may include a tenth transistor T10 and an eleventh transistor T11. A control electrode of the tenth transistor 10 is connected to a fifth node N5, a first electrode of the tenth transistor 10 is connected to the first power supply terminal VGL, and a second electrode of the tenth transistor 10 is connected to a light emitting signal output terminal EOUT. A control electrode of the eleventh transistor T11 is connected to the fourth node N4, a first electrode of the eleventh transistor T11 is connected to the second power supply terminal VGH, and a second electrode of the eleventh transistor T11 is connected to the light emitting signal output terminal EOUT.

As shown in FIG. 5A, the voltage stabilizing unit may include a first transistor T1 and a first capacitor C1. A control electrode of the first transistor T1 is connected to the first power supply terminal VGL, a first electrode of the first transistor T1 is connected to the first node N1, and a second electrode of the first transistor T1 is connected to the fifth node N5. A first electrode of the first capacitor C1 is connected to the first node N1, and a second electrode of the first capacitor C1 is connected to the light emitting signal output terminal EOUT.

In an exemplary embodiment, the first power supply terminal VGL is connected to a second power supply line VSS, and the second power supply terminal VGH is connected to a first power supply line VDD.

In an exemplary embodiment, if a first light emitting signal driver is implemented by a shift register, a clock signal terminal of the first light emitting signal driver corresponds to a first clock signal terminal ECK or a second clock signal terminal ECB in the shift register. Similarly, if a second light emitting signal driver is implemented by a shift register, a clock signal terminal of the second light emitting signal driver corresponds to a first clock signal terminal ECK or a second clock signal terminal ECB in the shift register.

Figure 5B:
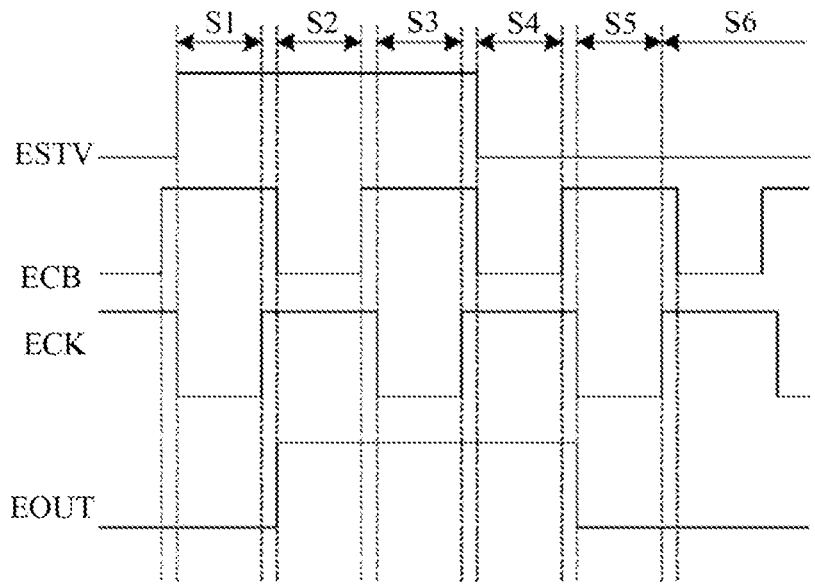
FIG. 5B is a timing diagram of a shift register according to an embodiment of the present disclosure.

FIG. 5B is a timing diagram of a shift register according to an embodiment of the present disclosure. A working process of the shift register shown in FIG. 5A of the present disclosure is briefly described below with reference to a timing diagram. That all transistors in FIG. 5A are P-type transistors is taken as an example for illustration.

The first power supply terminal VGL continuously outputs a low level, and the second power supply terminal VGH continuously outputs a high level.

In an exemplary embodiment, as shown in FIG. 5A, that the shift register is used to achieve a light emitting signal driver and a driving control transistor T0 is used to achieve a driving control circuit is taken as an example, a second electrode of the driving control transistor T0 (driving control circuit) is connected with a starting node NO of the shift register (light emitting signal driver), a first electrode of the driving control transistor T0 (driving control circuit) is connected to an OFF signal terminal EM_OFF, a control electrode of the driving control transistor T0 (driving control circuit) is connected to a control signal terminal EM_SW, then, when a first display region is in a state of not displaying, the OFF signal terminal EM_OFF provides a signal to a starting node NO of a first light emitting signal driver. When the first display region is in a state of displaying, a light emitting signal input terminal ESTV of the first light emitting signal driver provides a signal to the starting node NO of the first light emitting signal driver. Here, in FIG. 5A, that the driving control circuit includes a single-gate driving control transistor T0 is taken as an example. In another exemplary embodiment, a driving control transistor T0 may be a double-gate transistor, wherein two gates of the double-gate transistor are connected, and then connected to the control signal terminal EM_SW.

Taking a light emitting signal input terminal of a first light emitting signal driver providing a signal to a starting node of the first light emitting signal driver as an example, as shown in FIGS. 5A and 5B, a working process of the shift register in the embodiment of the present disclosure may include the following stages.

In a first stage S1, the first clock signal terminal ECK is at low level, the seventh transistor T7 is ON, the starting node NO provides a signal of the light emitting signal input terminal ESTV to the first node N1, the first transistor T1 is ON, the signal of the first node N1 is transmitted to the fifth node N5 through the first transistor T1, the first node N1 and the fifth node N5 are both at high level, the ninth transistor T9, the fourth transistor T4, and the tenth transistor T10 are all OFF, and a signal of the first power supply terminal VGL cannot be provided to the light emitting signal output terminal EOUT. The eighth transistor T8 is ON, a signal of the first power supply terminal VGL is provided to the second node N2, and the second node N2 is at low level. The fifth transistor T5 is ON, a signal of the second power supply terminal VGH is provided to the sixth node N6, and the sixth node N6 is at high level. The second clock signal terminal ECB is at high level, and the sixth transistor T6 is OFF. The second transistor T2 is ON, a signal of the second clock signal terminal ECB is provided to the third node N3, the third node N3 is at high level, and the second capacitor C2 is charged. The third transistor T3 is OFF, the fourth node N4 is floating, a previous high level is kept, and the eleventh transistor is controlled to be OFF. The light emitting output terminal EOUT keeps a previous low-level output.

In a second stage S2, the first clock signal terminal ECK is at a high level and both the seventh transistor T7 and the eighth transistor T8 are OFF. The second node N2 is in a floating state to maintain a previous low level, and the second transistor T2 is ON, so that the third node N3 is changed from a high level to a low level. Due to a bootstrapping effect of the second capacitor C2, a level of the second node N2 is further pulled down from a low level, thereby enhancing an output capability of the fifth transistor T5. The sixth transistor T6 is ON, a signal of the second power supply terminal VGH is provided to the first node N1 through the fifth transistor T5, the sixth node N6, and the sixth transistor T6, and the first node N1 is kept at a high level. A signal of the first node N1 is transmitted to the fifth node N5 through the first transistor, and both the first node N1 and the fifth node N5 are at a high level. The ninth transistor T9 is OFF, the fourth transistor T4 is OFF, the tenth transistor T10 is OFF, and a signal of the first power supply terminal VGL cannot be provided to the light emitting output terminal EOUT. The third transistor T3 is ON, a low level of the third node N3 is transmitted to the fourth node N4 through the third transistor T3, the fourth node N4 is at a low level, the eleventh transistor T11 is ON, a signal of the second power supply terminal VGH is provided to the light emitting output terminal EOUT, and the light emitting output terminal EOUT outputs a high level.

In a third stage S3, the first clock signal terminal ECK is at a low level, and the seventh transistor T7 is ON to provide a signal of the light emitting signal input terminal ESTV to the first node N1. The first transistor T1 is ON, a signal of the first node N1 is transmitted to the fifth node N5 through the first transistor T1, the first node N1 and the fifth node N5 are both at a high level, the ninth transistor T9, the fourth transistor T4, and the tenth transistor T10 are all OFF, and a signal of the first power supply terminal VGL cannot be provided to the light emitting output terminal EOUT. The eighth transistor T8 is ON, the signal of the first power supply terminal VGL is provided to the second node N2, and the second node N2 is kept at a low level. The fifth transistor T5 is ON, a signal of the second power supply terminal VGH is provided to the sixth node N6, and the sixth node N6 is at a high level. The second clock signal terminal ECB is at a high level, and the sixth transistor T6 is OFF. The second transistor T2 is ON, a signal of the second clock signal terminal ECB is provided to the third node N3, the third node N3 is at a high level, and the second capacitor C2 is charged. The third transistor T3 is OFF, the fourth node N4 is in a floating state to keep a state of the second stage (i.e. a low level), the eleventh transistor is ON, the signal of the second power supply terminal VGH is provided to the light emitting output terminal EOUT, and the light emitting output terminal EOUT outputs a high level.

In a fourth stage S4, the first clock signal terminal ECK is at a high level and both the seventh transistor T7 and the eighth transistor T8 are OFF. The second node N2 is in a floating state to keep a previous low level, and the second transistor T2 is ON, so that the third node N3 is changed from a high level to a low level. Due to a bootstrapping effect of the second capacitor C2, a level of the second node N2 is further pulled down from a low level, and a low level of the second node N2 can turn on the fifth transistor T5. The sixth transistor T6 is ON, a signal of the second power supply terminal VGH is provided to the first node N1 through the fifth transistor T5, the sixth node N6, and the sixth transistor T6, and the first node N1 is kept at a high level. The first transistor T1 is ON, a signal of the first node N1 is transmitted to the fifth node N5 through the first transistor T1, and the fifth node N5 is kept at a high level. The ninth transistor T9 is OFF, the fourth transistor T4 is OFF, the tenth transistor T10 is OFF, and a signal of the first power supply terminal VGL cannot be provided to the light emitting output terminal EOUT. The third transistor T3 is ON, a low level of the third node N3 is transmitted to the fourth node N4 through the third transistor T3, the fourth node N4 is at a low level, the eleventh transistor T11 is ON, a signal of the second power supply terminal VGH is provided to the light emitting output terminal EOUT, and the light emitting output terminal EOUT outputs a high level.

In a fifth stage S5, the first clock signal terminal ECK is at a low level, the eighth transistor T8 and the ninth transistor T9 are ON, and both a signal of the first power supply terminal VGL and a signal of the first clock signal terminal ECK are provided to the second node N2 to keep a low level of the second node N2. The fifth transistor T5 is ON under control of the second node N2, and a signal of the second power supply terminal VGH is provided to the sixth node N6. The second clock signal terminal ECB is at a high level, and the sixth transistor T6 is OFF. The second transistor T2 is ON, a signal of the second clock signal terminal ECB is provided to the third node N3, the third node N3 is changed to at a high level, and the second capacitor C2 is charged. The second clock signal terminal ECB is at a high level, and the third transistor T3 is OFF. The seventh transistor T7 is ON, and a signal of the signal input terminal ESTV is provided to the first node N1. The first node N1 is at a low level. Under control of the low level of the first node N1, the fourth transistor T4 is ON, a signal of the second power supply terminal VGH is provided to the fourth node N4, the fourth node N4 is at a high level, so that the eleventh transistor T11 is OFF, and the signal of the second power supply terminal VGH cannot be provided to the light emitting signal output terminal EOUT. The first transistor T1 is ON, a low-level signal of the first node N1 is transmitted to the fifth node N5 through the first transistor T1, the fifth node N5 is at a low level, the tenth transistor T10 is ON, a signal of the first power supply terminal VGL is provided to the light emitting signal output terminal EOUT through the tenth transistor T10, and the light emitting signal output terminal EOUT outputs a low level. A level of the second clock signal terminal ECB may change slightly earlier than a level of the first clock signal terminal ECK, that is, the level of the second clock signal terminal ECB first goes higher and then the level of the first clock signal terminal ECK goes lower. Therefore, it is ensured that the third transistor T3 is OFF so that the fourth node N4 is in a floating state to ensure that a high-level signal of the second power supply terminal VGH may be provided to the fourth node N4.

In a sixth stage S6, the light emitting signal input terminal ESTV is continuously at a low level, and the first clock signal terminal ECK and the second clock signal terminal ECB are respectively continuously switched between a high level and a low level, i.e. the present stage is a longer holding stage until arrival of a next first stage S1. The sixth stage S6 includes a transition stage S6'. In the transition stage S6', the first clock signal terminal ECK and the second clock signal terminal ECB are both at a high level, the sixth transistor T6, the seventh transistor T7, and the eighth transistor T8 are all controlled to be OFF, and the first node N1 is in a floating state and kept at a low level. The first node N1 controls the ninth transistor T9 to be ON, and a high-level signal of the first clock signal terminal ECK is provided to the second node N2, so that the second node N2 turns to be at a high level, and the second transistor T2 is controlled to be OFF. The third transistor T3 is OFF. Under control of a low level of the first node N1, the fourth transistor T4 is ON, a signal of the second power supply terminal VGH is provided to the fourth node N4, the fourth node N4 is at a high level, the eleventh transistor T11 is controlled to be OFF, and a high-level signal of the second power supply terminal VGH cannot be output to the light emitting signal output terminal EOUT. The low level of the first node N1 is transmitted to the fifth node N5, the tenth transistor T10 is controlled to be ON, a signal of the first power supply terminal VGL is provided to the light emitting signal output terminal EOUT, and the light emitting signal output terminal EOUT continuously outputs a low level. At the time except the transition stage, when the first clock signal terminal ECK is at a low level and the second clock signal terminal ECB is at a high level, a circuit state is the same as that in the fifth stage, and a shift register outputs a low level.

When the first clock signal terminal ECK is at a high level and the second clock signal terminal ECB is at a low level, the first node N1 and the second node N2 are both in a floating state. Although the sixth transistor is ON under control of the second clock signal terminal ECB, the first capacitor C1 may keep the first node N1 at a low level, so that the tenth transistor T10 is kept ON, a signal of the first power supply terminal VGL is provided to the light emitting signal output terminal EOUT, and the light emitting signal output terminal EOUT continuously outputs a low level. The first node N1 keeps a low level, and may control the ninth transistor T9 to be ON, and a signal of the first clock signal terminal ECK is provided to the second node N2, so that the second node N2 is at a high level, and the second transistor T2 is controlled to be OFF. Under control of the low level of the first node N1, the fourth transistor T4 is continuously ON, a signal of the second power supply terminal VGH is continuously provided to the fourth node N4, the fourth node N4 keeps a high level, and the eleventh transistor T11 is OFF. Therefore, in the sixth stage S6 (i.e. after the fifth stage S5 and before arrival of a next first stage S1), the signal of the first power supply terminal VGL is continuously provided to the light emitting signal output terminal EOUT, and the light emitting signal output terminal EOUT continuously outputs a low level.

An embodiment of the present disclosure further provides a driving method of the display panel corresponding to one or more embodiments provided above. As shown in FIG. 2, the display panel includes a first display region, a second display region, and a non-display region located around the first display region and the second display region, each of the first display region and the second display region may include a pixel driving circuit, and the non-display region includes the driving circuit in one or more of the above embodiments.

The driving method may include: in a first display state, an OFF signal terminal is controlled to provide a signal to a starting node of a first light emitting signal driver according to a control signal of an ON level provided by a control signal terminal; wherein, the first display state refers to a state in which the first display region is not displaying and the second display region is displaying; a light emitting signal output terminal of the first light emitting signal driver is controlled to provide an OFF-level signal to a light emitting control terminal of a pixel driving circuit in a first display region according to the signal of the OFF signal terminal; a signal of a light emitting signal input terminal of a second light emitting signal driver is provided to a starting node of the second light emitting signal driver; and a light emitting signal output terminal of the second light emitting signal driver is controlled to provide a light emitting signal to a light emitting control terminal of a pixel driving circuit in a second display region according to the signal of the light emitting signal input terminal of the second light emitting signal driver.

In an exemplary embodiment, pixel driving circuits in the first display region and the second display region may be 3T1C, 4T1C, 5T1C, 5T2C, 6T1C, or 7T1C structures, etc. For example, as shown in FIG. 1A, the pixel driving circuit may include seven switching transistors (twelfth transistor T12 to eighteenth transistor T18), one storage capacitor Cst, and seven signal lines (a data signal line DATA, a first scanning signal line S1 (scanning signal line), a second scanning signal line S2 (reset control signal line), a light emitting signal line EM, an initial signal line INIT, a first power supply line VDD, and a second power supply line VSS). A first terminal of the storage capacitor Cst is connected with the first power supply line VDD, and a second terminal of the storage capacitor Cst is connected with a second node N2, that is, the second terminal of the storage capacitor Cst is connected with a control electrode of a fourteenth transistor T14. A control electrode of the twelfth transistor T12 is connected to the second scanning signal line S2, a first electrode of the twelfth transistor T12 is connected to the initial signal line INIT, and a second electrode of the twelfth transistor T12 is connected to the second node N2. When an on-level scanning signal is applied to the second scanning signal line S2, the twelfth transistor T12 transmits an initialization voltage to the control electrode of the fourteenth transistor T14 to initialize a charge amount of the control electrode of the fourteenth transistor T14. A control electrode of the thirteenth transistor T13 is connected to the first scanning signal line S1, a first electrode of the thirteenth transistor T13 is connected to the second node N2, and a second electrode of the thirteenth transistor T13 is connected to the third node N3. When an on-level scanning signal is applied to the first scanning signal line S1, the thirteenth transistor T13 connects the control electrode of the fourteenth transistor T14 to the second electrode. A control electrode of the fourteenth transistor T14 is connected to the second node N2, i.e., the control electrode of the fourteenth transistor T14 is connected to the second terminal of the storage capacitor Cst, a first electrode of the fourteenth transistor T14 is connected to the first node N1, and a second electrode of the fourteenth transistor T14 is connected to the third node N3. The fourteenth transistor T14 may be referred to as a driving transistor, and the fourteenth transistor T14 determines an amount of driving current flowing between the first power supply line VDD and the second power supply line VSS according to a potential difference between the control electrode and the first electrode of the fourteenth transistor T14. A control electrode of the fifteenth transistor T15 is connected to the first scanning signal line S1, a first electrode of the fifteenth transistor T15 is connected to the data signal line DATA and a second electrode of the fifteenth transistor T15 is connected to the first node N1. The fifteenth transistor T15 may be referred to as a switching transistor, a scanning transistor, etc., when an ON-level scanning signal is applied to the first scanning signal line S1, the fifteenth transistor T15 enables a data voltage of the data signal line DATA to be input to a pixel driving circuit. A control electrode of the sixteenth transistor T16 is connected to the light emitting signal line EM, a first electrode of the sixteenth transistor T16 is connected to the first power supply line VDD, and a second electrode of the sixteenth transistor T16 is connected to the first node N1. A control electrode of the sixth transistor T17 is connected to the light emitting signal line EM, a first electrode of the sixth transistor T17 is connected to the third node N3, and a second electrode of the sixth transistor T17 is connected to a first electrode of a light emitting device. The sixteenth transistor T16 and the seventeenth transistor T17 may be referred to as light emitting transistors. When an ON-level light emitting signal is applied to the light emitting signal line EM, the sixteenth transistor T16 and the seventeenth transistor T17 enable the light emitting device to emit light by forming a driving current path between the first power supply line VDD and the second power supply line VSS. A control electrode of the eighteenth transistor T18 is connected to the first scanning signal line S1, a first electrode of the eighteenth transistor T18 is connected to the initial signal line INIT, and a second electrode of the eighteenth transistor T18 is connected to the first electrode of the light emitting device. When an ON-level scanning signal is applied to the first scanning signal line S1, the eighteenth transistor T18 transmits an initialization voltage to the first electrode of the light emitting device to initialize or release an amount of charge accumulated in the first electrode of the light emitting device. A second electrode of the light emitting device is connected to the second power supply line VSS. The first scanning signal line S1 is a scanning signal line in a pixel driving circuit of a present display row, and the second scanning signal line S2 is a scanning signal line in a pixel driving circuit of a previous display row. That is, for an n-th display row, the first scanning signal line S1 is S(n), the second scanning signal line S2 is S(n−1), the second scanning signal line S2 of the present display row and the first scanning signal line S1 in the pixel driving circuit of the previous display row are the same signal line, which may reduce signal lines of the display panel and realize a narrow frame of the display panel.

In an exemplary embodiment, the twelfth transistor T12 to the eighteenth transistor T18 may be P-type transistors or may be N-type transistors. The use of the same type of transistors in a pixel driving circuit may simplify a process flow, reduce process difficulties of a display panel, and improve a yield of a product. In some possible embodiments, the twelfth transistor T12 to the eighteenth transistor T18 may include P-type transistors and N-type transistors.

In an exemplary embodiment, the first power supply line VDD may continuously provide a high-level signal.

In an exemplary embodiment, the second power supply line VSS may continuously provide a low-level signal.

In an exemplary embodiment, the first scanning signal line S1, the second scanning signal line S2, the light emitting signal line EM, and the initial signal line INIT extend along a horizontal direction, and the second power supply line VSS, the first power supply line VDD, and the data signal line DATA extend along a vertical direction.

Figure 6A:
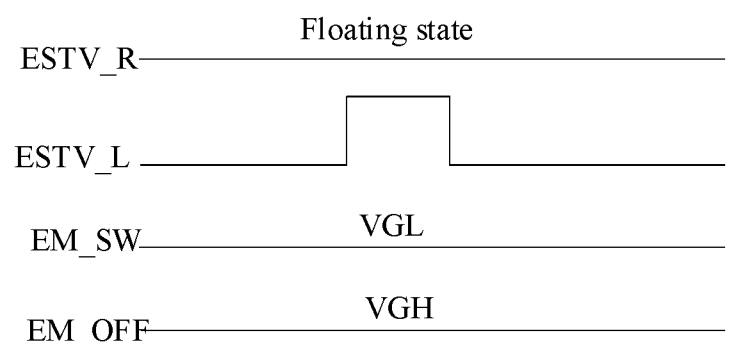
FIG. 6A is a timing diagram of a driving method of a display panel according to an embodiment of the present disclosure.
Figure 6B:
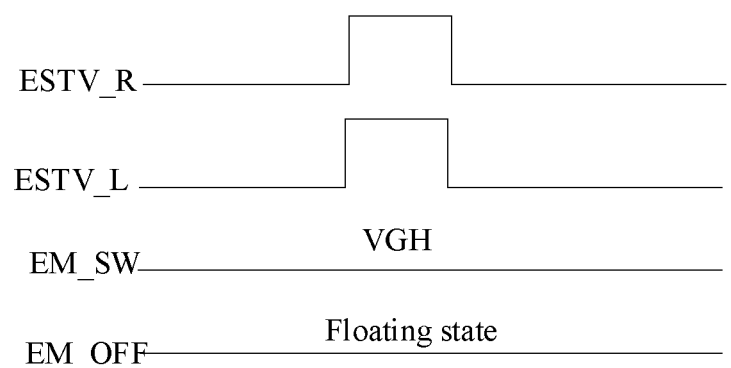
FIG. 6B is another timing diagram of a driving method of a display panel according to an embodiment of the present disclosure.

FIG. 6A is a signal timing diagram of a driving method of a display panel according to an embodiment of the present disclosure; FIG. 6B is another signal timing diagram of a driving method of a display panel according to an embodiment of the present disclosure. FIG. 6A shows a signal timing diagram when the display panel is in a first display state (a state where the first display region is not displaying and the second display region is displaying), and FIG. 6B shows a signal timing diagram when the display panel is in a second display state (i.e., a state where the first display region is displaying and the second display region is displaying). Here, high and low potentials of the signal timing diagrams shown in FIG. 6 are only schematic, and do not represent true potential values or relative proportions. Corresponding to the embodiment of the present disclosure, a low-level signal corresponds to an ON signal of a P-type transistor, while a high-level signal corresponds to an OFF signal of the P-type transistor.

In combination with the signal timing diagram shown in FIG. 6A and the pixel driving circuit shown in FIG. 1A, the driving method of the display panel according to the embodiment of the present disclosure will be explained by taking an example that all seven transistors in the pixel driving circuit illustrated in FIG. 1A are P-type transistors.

In combination with the signal timing diagrams shown in FIG. 6A and FIG. 6B, and taking the pixel driving circuit of the first display region being of the 7T1C structure illustrated in FIG. 1A as an example, an exemplary embodiment of the present disclosure is explained through a working process of the pixel driving circuit.

When a display panel is in a first display state, that is, when a first display region is not displaying and a second display region is displaying, a working process of a driving circuit may include the following parts.

In a first part, when the first display region is in a state of not displaying, a light emitting signal input terminal ESTV_R of a first light emitting signal driver is in a floating state, a control signal terminal EM_SW provides a low-level signal VGL to a control electrode of a first driving control circuit, and the first driving control circuit is ON so that an OFF signal terminal EM_OFF provides a high-level signal VGH to a starting node NO of the first light emitting signal driver. The first light emitting signal driver controls a light emitting signal output terminal EOUT of the first light emitting signal driver to provide a high-level signal to a light emitting control terminal EM of a pixel driving circuit in the first display region according to the high-level signal of the starting node NO (the signal of the OFF signal terminal EM_OFF), that is, to provide a high-level signal to control electrodes of a sixteenth transistor T16 and a seventeenth transistor T17 in the pixel driving circuit in the first display region, so that the sixteenth transistor T16 and the seventeenth transistor T17 in the pixel driving circuit in the first display region are turned off. In this way, the pixel driving circuit in the first display region may be turned off, thereby avoiding leakage current to emit light and reducing power consumption of the display panel.

In a second part, when the second display region is in a display state, a signal of a light emitting signal input terminal ESTV_L of a second light emitting signal driver is provided to a starting node NO of the second light emitting signal driver. Then a light emitting signal output terminal EOUT of the second light emitting signal driver is controlled to provide a corresponding light emitting signal to a light emitting control terminal EM of a pixel driving circuit in the second display region according to the signal of the light emitting signal input terminal ESTV_L of the second light emitting signal driver. In this way, normal display of the second display region may be achieved.

For example, a working process of the pixel driving circuit in the second display region may include the following three stages.

In a first stage A1 which is referred to as a reset stage, that a signal of the second scanning signal line S2 is a low-level signal and a signal of the first scanning signal line S1 is a high-level signal and a corresponding light emitting signal provided by the light emitting signal output terminal EOUT of the second light emitting signal driver to the light emitting control terminal EM of the pixel driving circuit in the second display region is a high-level signal is taken as an example. The signal of the second scanning signal line S2 is a low-level signal, so that the first transistor T11 is turned on, and a signal of the initial signal line INIT is provided to the second node N2 to initialize the storage capacitor Cst to clear an original data voltage in the storage capacitor. Since signals of the first scanning signal line S1 and the light emitting control terminal EM are high-level signals, the thirteenth transistor T13, the fifteenth transistor T15, the sixteenth transistor T16, the seventeenth transistor T17, and the eighteenth transistor T18 are turned off (OFF), so an OLED does not emit light at this stage.

In a second stage A2 which is referred to as a DATA writing stage or a threshold compensation stage, that a signal of the first scanning signal line S1 is a low-level signal and a signal of the second scanning signal line S2 is a high-level signal and a corresponding light emitting signal provided by the light emitting signal output terminal EOUT of the second light emitting signal driver to the light emitting control terminal EM of the pixel driving circuit in the second display region is a high-level signal is taken as an example, the data signal line Data outputs a data voltage. In this stage, since a second end of the storage capacitor Cst is at a low level, the fourteenth transistor T14 is turned on. The signal of the first scanning signal line S1 is a low-level signal, so that the thirteenth transistor T13, the fourth transistor T4, and the seventh transistor T7 are turned on. The thirteenth transistor T13 and the fifteenth transistor T15 are turned on, so that the data voltage output by the data signal line DATA is provided to the second node N2 through the first node N1, the turned-on fourteenth transistor T14, the third node N3, and the turned-on thirteenth transistor T13, a difference between the data voltage output by the data signal line DATA and a threshold voltage of the fourteenth transistor T14 is charged into the storage capacitor Cst, a voltage of the second terminal (the second node N2) of the storage capacitor Cst is Vd-Vd is the data voltage output by the data signal line DATA, and Vth is the threshold voltage of the fourteenth transistor T14. The eighteenth transistor T18 is turned on, so that an initial voltage of the initial signal line INIT is provided to a first electrode of the OLED to initialize (reset) the first electrode of the OLED to clear its internal pre-stored voltage to complete initialization, thus ensuring that the OLED does not emit light. The signal of the second scanning signal line S2 is a high-level signal, so that the twelfth transistor T12 is turned off. Since the signal of the light emitting control terminal EM is a high-level signal, the sixteenth transistor T16 and the seventeenth transistor T17 are turned off.

In a third stage A3 which is referred to as a light emitting stage, that signals of the first scanning signal line S1 and the second scanning signal line S2 are high-level signals and a corresponding light emitting signal provided by the light emitting signal output terminal EOUT of the second light emitting signal driver to the light emitting control terminal EM of the pixel driving circuit in the second display region is a low-level signal is taken as an example. In this stage, the signal of the light emitting control terminal EM is a low-level signal, so that the sixteenth transistor T16 and the seventeenth transistor T17 are turned on. A power supply voltage output by the first power supply line VDD provides a driving voltage to the first electrode of the OLED through the turned-on sixteenth transistor T16, fourteenth transistor T14, and seventeenth transistor T17, to drive the OLED to emit light.

In a third part, when the first display region is in a display state, a signal of the light emitting signal input terminal ESTV_R of the first light emitting signal driver is provided to the starting node NO of the first light emitting signal driver. Then the light emitting signal output terminal EOUT of the first light emitting signal driver is controlled to provide a corresponding light emitting signal to the light emitting control terminal EM of the pixel driving circuit in the first display region according to the signal of the light emitting signal input terminal ESTV_R of the first light emitting signal driver. In this way, normal display of the first display region may be achieved.

Here, the working process of the pixel driving circuit when the first display region is in the display state is similar to that of the pixel driving circuit when the second display region is in a display state in the above-mentioned second part, which may be understood with reference to the above description, and will not be repeated here.

In addition, for the driving circuit of the display panel shown in FIG. 3, when a second display region is in a state of not displaying, the working process of the driving circuit may further include: a light emitting signal input terminal ESTV_L of a second light emitting signal driver is in a floating state, a control signal terminal EM_SW provides a low-level signal VGL to a control electrode of a second driving control circuit, and the second driving control circuit is turned on so that an OFF signal terminal EM_OFF provides a high-level signal VGH to a starting node NO of the second light emitting signal driver. The second light emitting signal driver controls a light emitting signal output terminal EOUT of the second light emitting signal driver to provide a high-level signal to a light emitting control terminal EM of a pixel driving circuit in the second display region according to the high-level signal of the starting node NO (the signal of the OFF signal terminal EM_OFF), that is, to provide a high-level signal to control electrodes of a sixteenth transistor T16 and a seventeenth transistor T17 in the pixel driving circuit in the second display region, so that the sixteenth transistor T16 and the seventeenth transistor T17 in the pixel driving circuit in the second display region are turned off. In this way, the pixel driving circuit in the second display region is turned off, thereby avoiding leakage current to emit light and reducing power consumption of a display panel.

An embodiment of the present disclosure further provides a display panel, which may include a first display region, a second display region, and a non-display region located around the first display region and the second display region, each of the first display region and the second display region may include a pixel driving circuit, and the non-display region includes the driving circuit in the display panel in one or more of the above embodiments.

Here, the non-display region may refer to a region that may be used for setting a circuit except for an entire display region formed by the first display region and the second display region. As shown in FIG. 4, the non-display region is located on a lower side of the first display region 11 and the second display region 12.

In an exemplary embodiment, a display panel may be a foldable display panel.

In an exemplary embodiment, taking a display panel as a foldable display panel as an example, a folding region is included between a first display region and a second display region, and the folding region may be bent so that the first display region is bent to a non-display side of the second display region. When a state between the first display region and the second display region changes from an expanded state to a folded state, the display panel is switched to a first display state or a third display state. Here, the first display state refers to a state in which the first display region is not displaying and the second display region is displaying; and the third display state refers to a state in which the first display region is displaying and the second display region is not displaying.

For example, as shown in FIG. 4, it may be folded from right to left in a paper direction, so that a folding region is curved, and a first display region is bent to a non-display side of a second display region, that is, a state between the first display region and the second display region changes to a folded state. At this time, the display panel may be switched to a first display state or a third display state. Or, it may be folded from left to right in a paper direction, so that a folded region is curved, and a second display region is bent to a non-display side of a first display region. At this time, the display panel may be switched to a first display state or a third display state. Here, an expanded state of the display panel is shown in FIG. 4, and a folded state of the display panel is not shown.

An embodiment of the present disclosure further provides a display apparatus, which may include the display panel provided in one or more abovementioned embodiments.

In an exemplary embodiment, the display apparatus may be any product or component with a display function such as a mobile phone, a tablet computer, a television, a display, a laptop computer, a digital photo frame, and a navigator. The embodiment of the present disclosure does not limit a type of the display apparatus.

Although the embodiments disclosed in the present disclosure are as described above, the aforementioned content is only embodiments used for facilitating understanding of the present disclosure, and is not intended to limit the present disclosure. Anyone skilled in the art to which the present disclosure belongs may make any modifications and changes in implementation forms and details without departing from the spirit and scope disclosed in the present disclosure. However, the scope of patent protection of the present disclosure is still subject to the scope defined by the appended claims.

What is claimed is:

1. A driving circuit of a display panel, wherein:
   the display panel comprises a first display region and a second display region;
   the driving circuit comprises a first light emitting signal driver and a first driving control circuit corresponding to the first display region, and a second light emitting signal driver corresponding to the second display region;
   the first driving control circuit is respectively connected with a control signal terminal, an OFF signal terminal, and a starting node of the first light emitting signal driver, and the first driving control circuit is configured to: in a first display state, control the OFF signal terminal to provide a signal of the OFF signal terminal to the starting node of the first light emitting signal driver according to a control signal of an ON level provided by the control signal terminal;
   the first driving control circuit is further configured to: in a second display state, control a light emitting signal input terminal of the first light emitting signal driver to provide a signal to the starting node of the first light emitting signal driver according to a control signal of an OFF level provided by the control signal terminal;
   wherein the first display state refers to a state in which the first display region is not displaying and the second display region is displaying;
   wherein the second display state is a state in which the first display region is displaying and the second display region is displaying;
   the first light emitting signal driver is connected with a light emitting control terminal of a pixel driving circuit in the first display region, and is configured to, in the first display state, control a light emitting signal output terminal of the first light emitting signal driver to provide an OFF-level signal to the light emitting control terminal of the pixel driving circuit in the first display region according to the signal of the OFF signal terminal, wherein in the first display state, the first driving control circuit is in a working state, and the light emitting control terminal of the pixel driving circuit in the first display region is in an OFF state; and the second light emitting signal driver is connected with a light emitting control terminal of a pixel driving circuit in the second display region, and is configured to, in the first display state, provide a signal of a light emitting signal input terminal of the second light emitting signal driver to a starting node of the second light emitting signal driver, and control a light emitting signal output terminal of the second light emitting signal driver to provide a light emitting signal to the light emitting control terminal of the pixel driving circuit in the second display region, wherein in the first display state, the first driving control circuit is in a working state, and the light emitting control terminal of the pixel driving circuit in the second display region is in a working state.

2. The driving circuit according to claim 1, wherein the first light emitting signal driver is further configured to control the light emitting signal output terminal of the first light emitting signal driver to provide a light emitting signal to the light emitting control terminal of the pixel driving circuit in the first display region according to the signal of the light emitting signal input terminal of the first light emitting signal driver.

3. The driving circuit according to claim 2, further comprising a second driving control circuit corresponding to the second display region, wherein, the second driving control circuit is respectively connected with the control signal terminal, the OFF signal terminal, and the starting node of the second light emitting signal driver, and is configured to, in a third display state or a fourth display state, control the OFF signal terminal to provide a signal to the starting node of the second light emitting signal driver according to a control signal of an ON level provided by the control signal terminal; wherein, the third display state refers to a state in which the first display region is displaying and the second display region is not displaying, and the fourth display state refers to a state in which the first display region is not displaying and the second display region is not displaying;

the second light emitting signal driver is further configured to, in the third display state or the fourth display state, control the light emitting signal output terminal of the second light emitting signal driver to provide an OFF-level signal to the light emitting control terminal of the pixel driving circuit in the second display region according to the signal of the OFF signal terminal.

4. The driving circuit according to claim 3, wherein the second driving control circuit is further configured to, in the first display state or the second display state, control the light emitting signal input terminal of the second light emitting signal driver to provide a signal to the starting node of the second light emitting signal driver according to a control signal of an OFF level provided by the control signal terminal.

5. The driving circuit according to claim 3, wherein in the first display state, a clock signal terminal of the second light emitting signal driver provides a signal to a clock signal terminal of the first light emitting signal driver; or, in the third display state, a clock signal terminal of the first light emitting signal driver provides a signal to a clock signal terminal of the second light emitting signal driver.

6. The driving circuit according to claim 5, further comprising a first timing controller corresponding to the first display region and a second timing controller corresponding to the second display region, wherein, the first timing controller is connected with the clock signal terminal of the first light emitting signal driver and is configured to, in the first display state or the fourth display state, stop providing a signal to the clock signal terminal of the first light emitting signal driver; or, in the second display state or the third display state, provide a signal to the clock signal terminal of the first light emitting signal driver;

the second timing controller is connected with the clock signal terminal of the second light emitting signal driver and is configured to, in the third display state or the fourth display state, stop providing a signal to the clock signal terminal of the second light emitting signal driver; or, in the first display state or the second display state, provide a signal to the clock signal terminal of the second light emitting signal driver.

7. The driving circuit according to claim 1, wherein the first driving control circuit comprises a driving control transistor, and a control electrode of the driving control transistor is connected to the control signal terminal, a first electrode of the driving control transistor is connected to the OFF signal terminal, and a second electrode of the driving control transistor is connected to the starting node of the first light emitting signal driver.

8. The driving circuit according to claim 1, wherein the first light emitting signal driver and the second light emitting signal driver comprise a shift register.

9. The driving circuit according to claim 8, wherein the shift register comprises an input unit, a first control unit, a second control unit, an output unit, and a voltage stabilizing unit; wherein the input unit comprises a seventh transistor, an eighth transistor, and a ninth transistor; a control electrode of the seventh transistor is connected to a first clock signal terminal, a first electrode of the seventh transistor is connected to a starting node, and a second electrode of the seventh transistor is connected to a first node; a control electrode of the eighth transistor is connected to the first clock signal terminal, a first electrode of the eighth transistor is connected to a first power supply terminal, and a second electrode of the eighth transistor is connected to a second node; a control electrode of the ninth transistor is connected to the first node, a first electrode of the ninth transistor is connected to the first clock signal terminal, and a second electrode of the ninth transistor is connected to the second node;

the first control unit comprises a second transistor, a third transistor, a fourth transistor, a second capacitor, and a third capacitor; a control electrode of the second transistor is connected to the second node, a first electrode of the second transistor is connected to a second clock signal terminal, and a second electrode of the second transistor is connected to a third node; a first electrode of the second capacitor is connected to the second node, and a second electrode of the second capacitor is connected to the third node; a control electrode of the third transistor is connected to the second clock signal terminal, a first electrode of the third transistor is connected to the third node, and a second electrode of the third transistor is connected to a fourth node; a first electrode of the third capacitor is connected to a second power supply terminal and a second electrode of the third capacitor is connected to the fourth node; a control electrode of the fourth transistor is connected to the first node, a second electrode of the fourth transistor is connected to the second power supply terminal, and a first electrode of the fourth transistor is connected to the fourth node;

the second control unit comprises a fifth transistor and a sixth transistor; a control electrode of the fifth transistor is connected to the second node, a first electrode of the fifth transistor is connected to the second power supply terminal, and a second electrode of the fifth transistor is connected to a sixth node; a control electrode of the sixth transistor is connected to the second clock signal terminal, a first electrode of the sixth transistor is connected to the sixth node, and a second electrode of the sixth transistor is connected to the first node;

the output unit comprises a tenth transistor and an eleventh transistor; a control electrode of the tenth transistor is connected to a fifth node, a first electrode of the tenth transistor is connected to the first power supply terminal, and a second electrode of the tenth transistor is connected to a light emitting signal output terminal; a control electrode of the eleventh transistor is connected to the fourth node, a first electrode of the eleventh transistor is connected to the second power supply terminal, and a second electrode of the eleventh transistor is connected to the light emitting signal output terminal;

the voltage stabilizing unit comprises a first transistor and a first capacitor; a control electrode of the first transistor is connected to the first power supply terminal, a first electrode of the first transistor is connected to the first node, and a second electrode of the first transistor is connected to the fifth node; a first electrode of the first capacitor is connected to the first node and a second electrode of the first capacitor is connected to the light emitting signal output terminal.

10. The driving circuit according to claim 1, wherein the pixel driving circuit comprises a twelfth transistor, a thirteenth transistor, a fourteenth transistor, a fifteenth transistor, a sixteenth transistor, a seventeenth transistor, an eighteenth transistor, and a storage capacitor, wherein:

a first terminal of the storage capacitor is connected to a first power supply line and a second terminal of the storage capacitor is connected to a second node;

a control electrode of the twelfth transistor is connected to a second scanning signal line, a first electrode of the twelfth transistor is connected to an initial signal line, and a second electrode of the twelfth transistor is connected to the second node;

a control electrode of the thirteenth transistor is connected to a first scanning signal line, a first electrode of the thirteenth transistor is connected to the second node, and a second electrode of the thirteenth transistor is connected to a third node;

a control electrode of the fourteenth transistor is connected to the second node, a first electrode of the fourteenth transistor is connected to a first node, and a second electrode of the fourteenth transistor is connected to the third node;

a control electrode of the fifteenth transistor is connected to the first scanning signal line, a first electrode of the fifteenth transistor is connected to a data signal line, and a second electrode of the fifteenth transistor is connected to the first node;

a control electrode of the sixteenth transistor is connected to a light emitting control terminal, a first electrode of the sixteenth transistor is connected to the first power supply line, and a second electrode of the sixteenth transistor is connected to the first node;

a control electrode of the seventeenth transistor is connected to the light emitting control terminal, a first electrode of the seventeenth transistor is connected to the third node, and a second electrode of the seventeenth transistor is connected to a first electrode of a light emitting device;

a control electrode of the eighteenth transistor is connected to the first scanning signal line, a first electrode of the eighteenth transistor is connected to the initial signal line, and a second electrode of the eighteenth transistor is connected to the first electrode of the light emitting device.

11. A driving method of a display panel, wherein:

the display panel comprises a first display region, a second display region, and a non-display region located around the first display region and the second display region, each of the first display region and the second display region comprises a pixel driving circuit, and the non-display region comprises a driving circuit; wherein the driving circuit comprises a first light emitting signal driver and a first driving control circuit corresponding to the first display region, and a second light emitting signal driver corresponding to the second display region, wherein the first driving control circuit is respectively connected with a control signal terminal, an OFF signal terminal, and a starting node of the first light emitting signal driver; the first light emitting signal driver is connected with a light emitting control terminal of a pixel driving circuit in the first display region; and the second light emitting signal driver is connected with a light emitting control terminal of a pixel driving circuit in the second display region; and the driving method comprises:

in a first display state, controlling, by the first driving control circuit, the OFF signal terminal to provide a signal of the OFF signal terminal to the starting node of the first light emitting signal driver according to a control signal of an ON level provided by the control signal terminal; and in a second display state, controlling, by the first driving control circuit, a light emitting signal input terminal of the first light emitting signal driver to provide a signal to the starting node of the first light emitting signal driver according to a control signal of an OFF level provided by the control signal terminal;

wherein the first display state refers to a state in which the first display region is not displaying and the second display region is displaying; wherein the second display state is a state in which the first display region is displaying and the second display region is displaying;

in the first display state, controlling, by the first light emitting signal driver, a light emitting signal output terminal of the first light emitting signal driver to provide an OFF-level signal to the light emitting control terminal of the pixel driving circuit in the first display region according to the signal of the OFF signal terminal, wherein in the first display state, the first driving control circuit is in a working state, and the light emitting control terminal of the pixel driving circuit in the first display region is in an OFF state; and in the first display state, providing, by the second light emitting signal driver, a signal of the light emitting signal input terminal of the second light emitting signal driver to a starting node of the second light emitting signal driver, and controlling a light emitting signal output terminal of the second light emitting signal driver to provide a light emitting signal to the light emitting control terminal of the pixel driving circuit in the second display region, wherein in the first display state, the first driving control circuit is in a working state, and the light emitting control terminal of the pixel driving circuit in the second display region is in a working state.

12. A display panel, comprising a first display region, a second display region, and a non-display region located around the first display region and the second display region, wherein:
   each of the first display region and the second display region comprises a pixel driving circuit, and the non-display region comprises a driving circuit; the driving circuit comprises a first light emitting signal driver and a first driving control circuit corresponding to the first display region, and a second light emitting signal driver corresponding to the second display region;
   the first driving control circuit is respectively connected with a control signal terminal, an OFF signal terminal, and a starting node of the first light emitting signal driver;
   the first driving control circuit is configured to: in a first display state, control the OFF signal terminal to provide a signal of the OFF signal terminal to the starting node of the first light emitting signal driver according to a control signal of an ON level provided by the control signal terminal;
   the first driving control circuit is further configured to: in a second display state, control a light emitting signal input terminal of the first light emitting signal driver to provide a signal to the starting node of the first light emitting signal driver according to a control signal of an OFF level provided by the control signal terminal;
   the first display state refers to a state in which the first display region is not displaying and the second display region is displaying;
   the second display state is a state in which the first display region is displaying and the second display region is displaying;
   the first light emitting signal driver is connected with a light emitting control terminal of a pixel driving circuit in the first display region, and is configured to, in the first display state, control a light emitting signal output terminal of the first light emitting signal driver to provide an OFF-level signal to the light emitting control terminal of the pixel driving circuit in the first display region according to the signal of the OFF signal terminal, wherein in the first display state, the first driving control circuit is in a working state, and the light emitting control terminal of the pixel driving circuit in the first display region is in an OFF state; and
   the second light emitting signal driver is connected with a light emitting control terminal of a pixel driving circuit in the second display region, and is configured to, in the first display state, provide a signal of a light emitting signal input terminal of the second light emitting signal driver to a starting node of the second light emitting signal driver, and control a light emitting signal output terminal of the second light emitting signal driver to provide a light emitting signal to the light emitting control terminal of the pixel driving circuit in the second display region, wherein in the first display state, the first driving control circuit is in a working state, and the light emitting control terminal of the pixel driving circuit in the second display region is in a working state.

13. The display panel according to claim 12, wherein the display panel is a foldable display panel.

14. The display panel according to claim 12, wherein when a state between the first display region and the second display region changes from an expanded state to a folded state, the display panel is switched to the first display state or a third display state, wherein the third display state refers to a state in which the first display region is displaying and the second display region is not displaying.

15. The display panel according to claim 12, wherein
   the first light emitting signal driver is further configured to control the light emitting signal output terminal of the first light emitting signal driver to provide a light emitting signal to the light emitting control terminal of the pixel driving circuit in the first display region according to the signal of the light emitting signal input terminal of the first light emitting signal driver.

16. The display panel according to claim 12, wherein the first driving control circuit comprises a driving control transistor, and a control electrode of the driving control transistor is connected to the control signal terminal, a first electrode of the driving control transistor is connected to the OFF signal terminal, and a second electrode of the driving control transistor is connected to the starting node of the first light emitting signal driver.

17. The display panel according to claim 12, wherein the first light emitting signal driver and the second light emitting signal driver comprise a shift register, and the shift register comprises an input unit, a first control unit, a second control unit, an output unit, and a voltage stabilizing unit; wherein
   the input unit comprises a seventh transistor, an eighth transistor, and a ninth transistor; a control electrode of the seventh transistor is connected to a first clock signal terminal, a first electrode of the seventh transistor is connected to a starting node, and a second electrode of the seventh transistor is connected to a first node; a control electrode of the eighth transistor is connected to the first clock signal terminal, a first electrode of the eighth transistor is connected to a first power supply terminal, and a second electrode of the eighth transistor is connected to a second node; a control electrode of the ninth transistor is connected to the first node, a first electrode of the ninth transistor is connected to the first clock signal terminal, and a second electrode of the ninth transistor is connected to the second node;
   the first control unit comprises a second transistor, a third transistor, a fourth transistor, a second capacitor, and a third capacitor; a control electrode of the second transistor is connected to the second node, a first electrode of the second transistor is connected to a second clock signal terminal, and a second electrode of the second transistor is connected to a third node; a first electrode of the second capacitor is connected to the second node, and a second electrode of the second capacitor is connected to the third node; a control electrode of the third transistor is connected to the second clock signal terminal, a first electrode of the third transistor is connected to the third node, and a second electrode of the third transistor is connected to a fourth node; a first electrode of the third capacitor is connected to a second power supply terminal and a second electrode of the third capacitor is connected to the fourth node; a control electrode of the fourth transistor is connected to the first node, a second electrode of the fourth transistor is connected to the second power supply terminal, and a first electrode of the fourth transistor is connected to the fourth node;

the second control unit comprises a fifth transistor and a sixth transistor; a control electrode of the fifth transistor is connected to the second node, a first electrode of the fifth transistor is connected to the second power supply terminal, and a second electrode of the fifth transistor is connected to a sixth node; a control electrode of the sixth transistor is connected to the second clock signal terminal, a first electrode of the sixth transistor is connected to the sixth node, and a second electrode of the sixth transistor is connected to the first node;

the output unit comprises a tenth transistor and an eleventh transistor; a control electrode of the tenth transistor is connected to a fifth node, a first electrode of the tenth transistor is connected to the first power supply terminal, and a second electrode of the tenth transistor is connected to a light emitting signal output terminal; a control electrode of the eleventh transistor is connected to the fourth node, a first electrode of the eleventh transistor is connected to the second power supply terminal, and a second electrode of the eleventh transistor is connected to the light emitting signal output terminal;

the voltage stabilizing unit comprises a first transistor and a first capacitor; a control electrode of the first transistor is connected to the first power supply terminal, a first electrode of the first transistor is connected to the first node, and a second electrode of the first transistor is connected to the fifth node; a first electrode of the first capacitor is connected to the first node and a second electrode of the first capacitor is connected to the light emitting signal output terminal.

18. The display panel according to claim 12, wherein the pixel driving circuit comprises a twelfth transistor, a thirteenth transistor, a fourteenth transistor, a fifteenth transistor, a sixteenth transistor, a seventeenth transistor, an eighteenth transistor, and a storage capacitor, wherein, a first terminal of the storage capacitor is connected to a first power supply line and a second terminal of the storage capacitor is connected to a second node;

a control electrode of the twelfth transistor is connected to a second scanning signal line, a first electrode of the twelfth transistor is connected to an initial signal line, and a second electrode of the twelfth transistor is connected to the second node;

a control electrode of the thirteenth transistor is connected to a first scanning signal line, a first electrode of the thirteenth transistor is connected to the second node, and a second electrode of the thirteenth transistor is connected to a third node;

a control electrode of the fourteenth transistor is connected to the second node, a first electrode of the fourteenth transistor is connected to a first node, and a second electrode of the fourteenth transistor is connected to the third node;

a control electrode of the fifteenth transistor is connected to the first scanning signal line, a first electrode of the fifteenth transistor is connected to a data signal line, and a second electrode of the fifteenth transistor is connected to the first node;

a control electrode of the sixteenth transistor is connected to a light emitting control terminal, a first electrode of the sixteenth transistor is connected to the first power supply line, and a second electrode of the sixteenth transistor is connected to the first node;

a control electrode of the seventeenth transistor is connected to the light emitting control terminal, a first electrode of the seventeenth transistor is connected to the third node, and a second electrode of the seventeenth transistor is connected to a first electrode of a light emitting device;

a control electrode of the eighteenth transistor is connected to the first scanning signal line, a first electrode of the eighteenth transistor is connected to the initial signal line, and a second electrode of the eighteenth transistor is connected to the first electrode of the light emitting device.

19. A display apparatus, comprising the display panel according to claim 12.

* * * * *